(12) United States Patent
Grivna et al.

(10) Patent No.: US 8,012,857 B2
(45) Date of Patent: Sep. 6, 2011

(54) SEMICONDUCTOR DIE SINGULATION METHOD

(75) Inventors: Gordon M. Grivna, Mesa, AZ (US); Michael J. Seddon, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 129 days.

(21) Appl. No.: 12/689,110

(22) Filed: Jan. 18, 2010

(65) Prior Publication Data
US 2010/0120227 A1    May 13, 2010

Related U.S. Application Data

(63) Continuation-in-part of application No. 11/834,924, filed on Aug. 7, 2007, now Pat. No. 7,781,310.

(51) Int. Cl.
*H01L 21/00* (2006.01)
(52) U.S. Cl. ........ 438/462; 438/113; 438/114; 438/460; 438/700; 438/704; 438/710; 438/745
(58) Field of Classification Search .................. 438/113, 438/114, 460, 462, 700, 704, 706, 710, 745, 438/FOR. 118, FOR. 386
See application file for complete search history.

(56) References Cited

U.S. PATENT DOCUMENTS

| | | | |
|---|---|---|---|
| 4,820,377 A | 4/1989 | Davis et al. | |
| 5,075,253 A | 12/1991 | Sliwa, Jr. | |
| 5,856,705 A | 1/1999 | Ting | |
| 6,030,885 A | 2/2000 | Bothra | |
| 6,214,703 B1 | 4/2001 | Chen et al. | |
| 6,342,724 B1 | 1/2002 | Wark et al. | |
| 6,642,127 B2 | 11/2003 | Kumar et al. | |
| 6,686,225 B2 | 2/2004 | Wachtler | |
| 6,897,128 B2 | 5/2005 | Arita | |
| 6,969,669 B2 | 11/2005 | Arita | |
| 7,060,531 B2 | 6/2006 | Arita | |
| 7,129,114 B2 | 10/2006 | Akram | |
| 7,253,477 B2 | 8/2007 | Loechelt et al. | |
| 7,335,576 B2 | 2/2008 | David et al. | |
| 7,488,668 B2 | 2/2009 | Arita et al. | |
| 7,629,228 B2 | 12/2009 | Haji et al. | |
| 7,678,670 B2 | 3/2010 | Arita et al. | |
| 7,767,551 B2 | 8/2010 | Arita et al. | |
| 7,846,848 B2 * | 12/2010 | Lewington et al. | 438/723 |
| 7,906,410 B2 | 3/2011 | Arita et al. | |
| 2004/0102025 A1 | 5/2004 | Arita | |
| 2005/0084996 A1 | 4/2005 | Harper | |
| 2006/0030078 A1 | 2/2006 | Jiang et al. | |
| 2006/0118515 A1 | 6/2006 | Dolechek et al. | |
| 2006/0244096 A1 | 11/2006 | Sekiya | |
| 2007/0087524 A1 | 4/2007 | Montgomery | |
| 2007/0132034 A1 | 6/2007 | Curello et al. | |
| 2009/0057838 A1 | 3/2009 | Arita et al. | |
| 2009/0065904 A1 | 3/2009 | Wang | |
| 2010/0048001 A1 | 2/2010 | Harikai et al. | |
| 2010/0055875 A1 | 3/2010 | Haji et al. | |
| 2010/0173474 A1 | 7/2010 | Arita et al. | |

FOREIGN PATENT DOCUMENTS

WO    WO 01/56063 A2    8/2001

(Continued)

*Primary Examiner* — N Drew Richards
*Assistant Examiner* — Joannie A Garcia
(74) *Attorney, Agent, or Firm* — Robert F. Hightower

(57) ABSTRACT

In one embodiment, semiconductor die are singulated from a semiconductor wafer by etching openings completely through the semiconductor wafer.

15 Claims, 27 Drawing Sheets

FOREIGN PATENT DOCUMENTS

| | | |
|---|---|---|
| WO | WO 01/56063 A3 | 8/2001 |
| WO | 2004066382A1 PB | 8/2004 |
| WO | 2007007883A1 PB | 1/2007 |
| WO | 2008081968A1 PB | 7/2008 |
| WO | 2009063620A1 PB | 5/2009 |

* cited by examiner

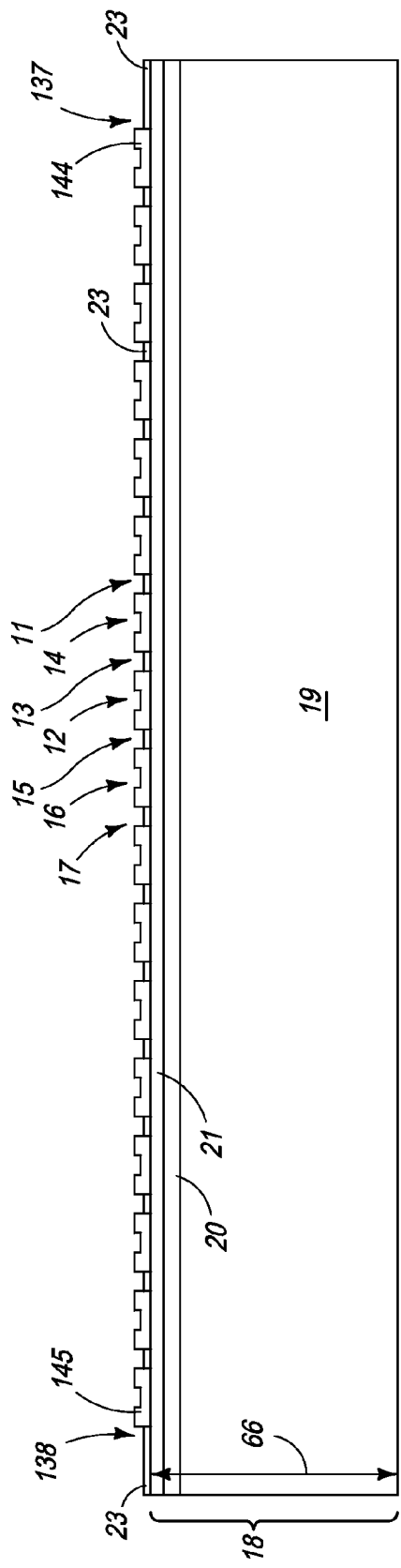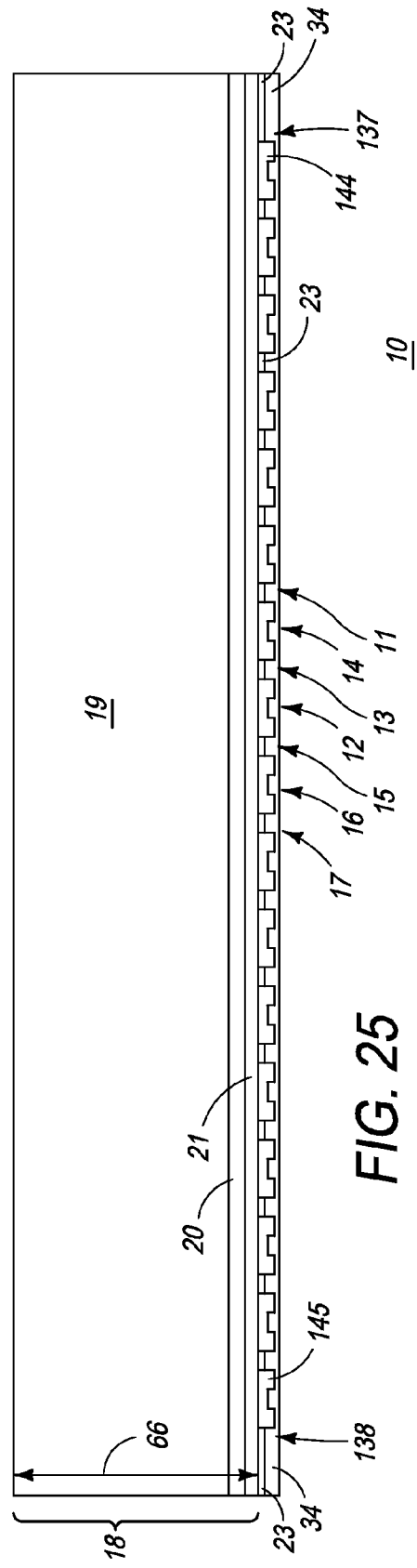

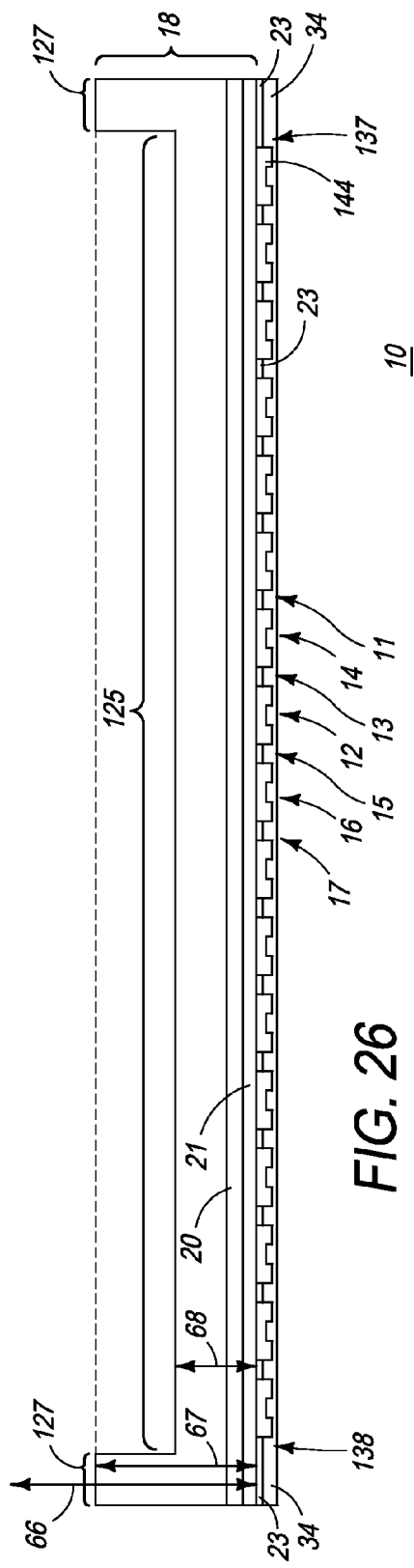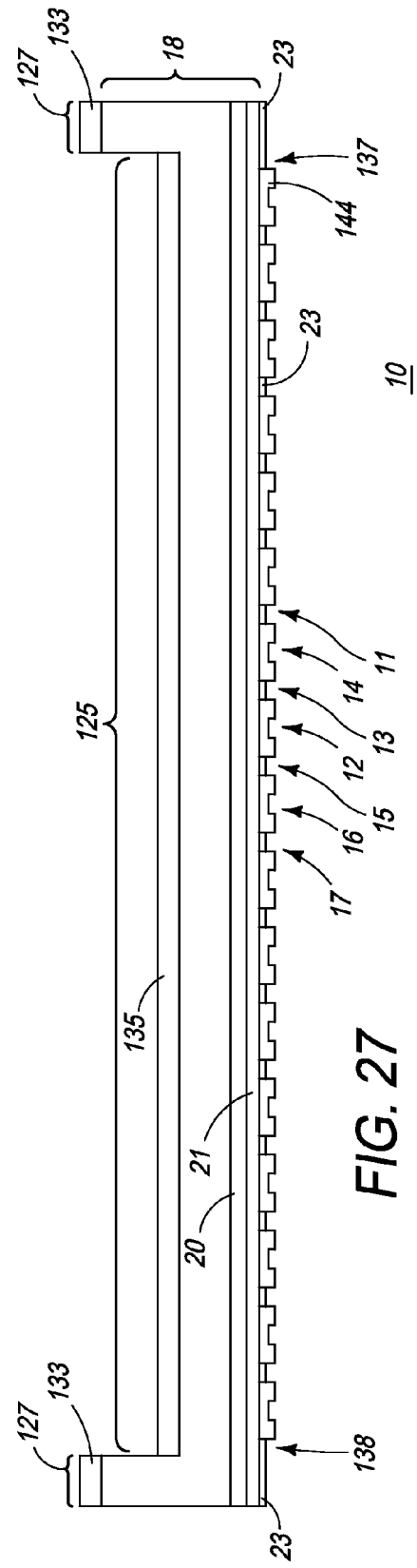

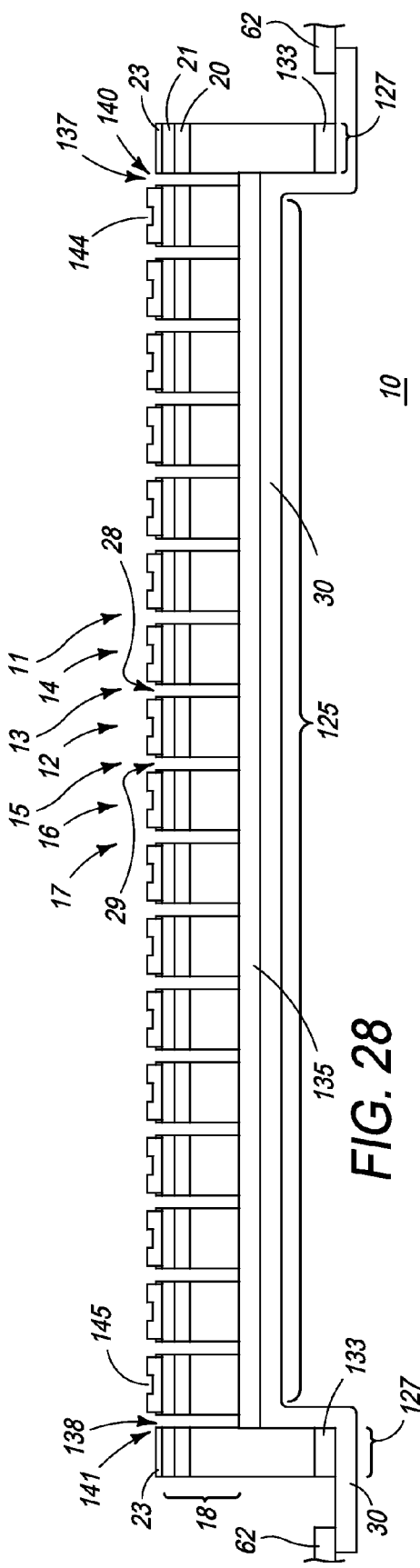
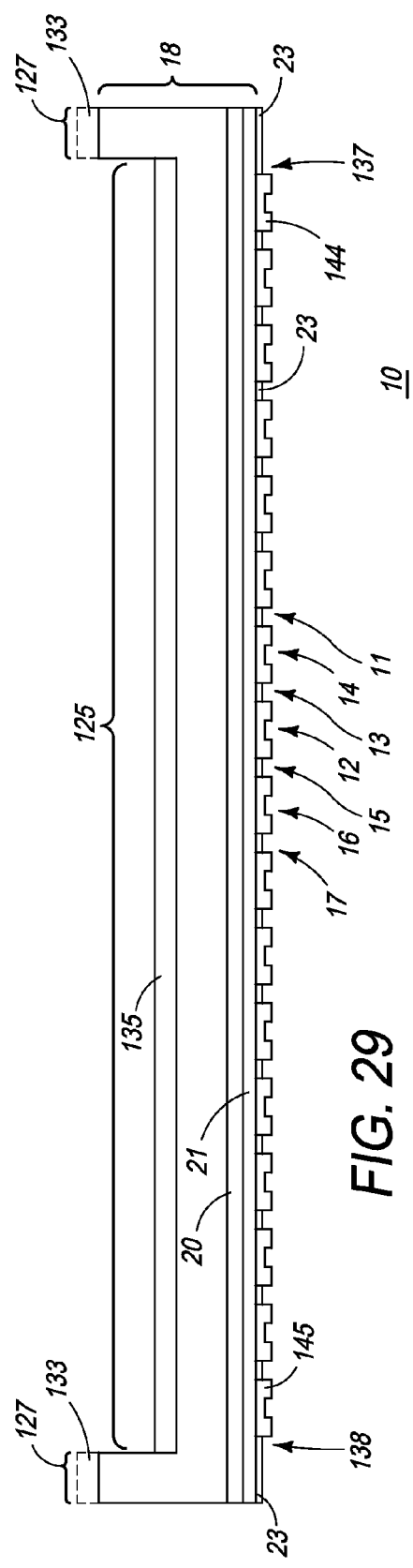

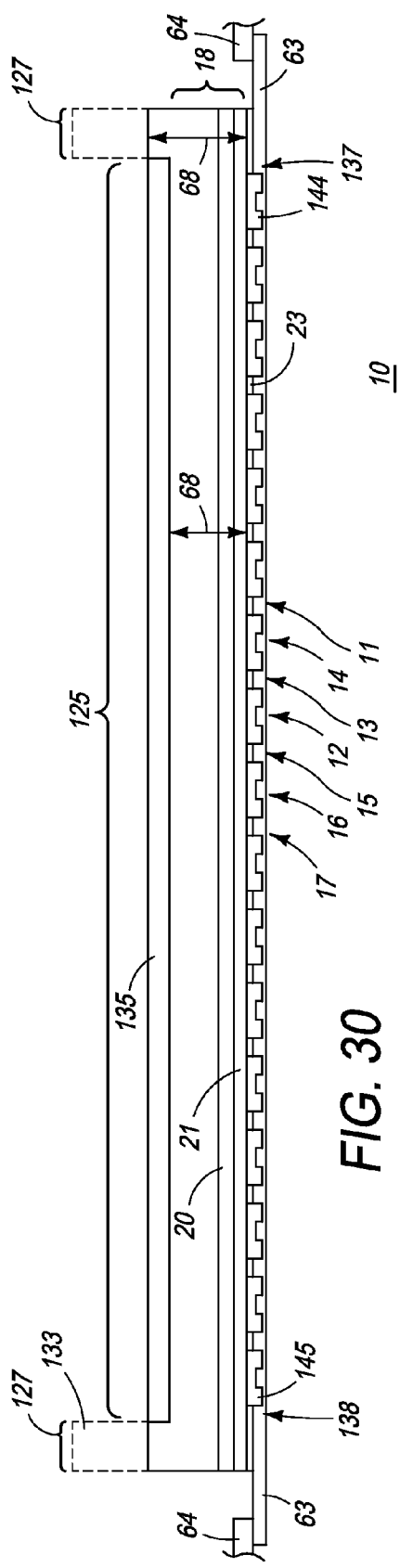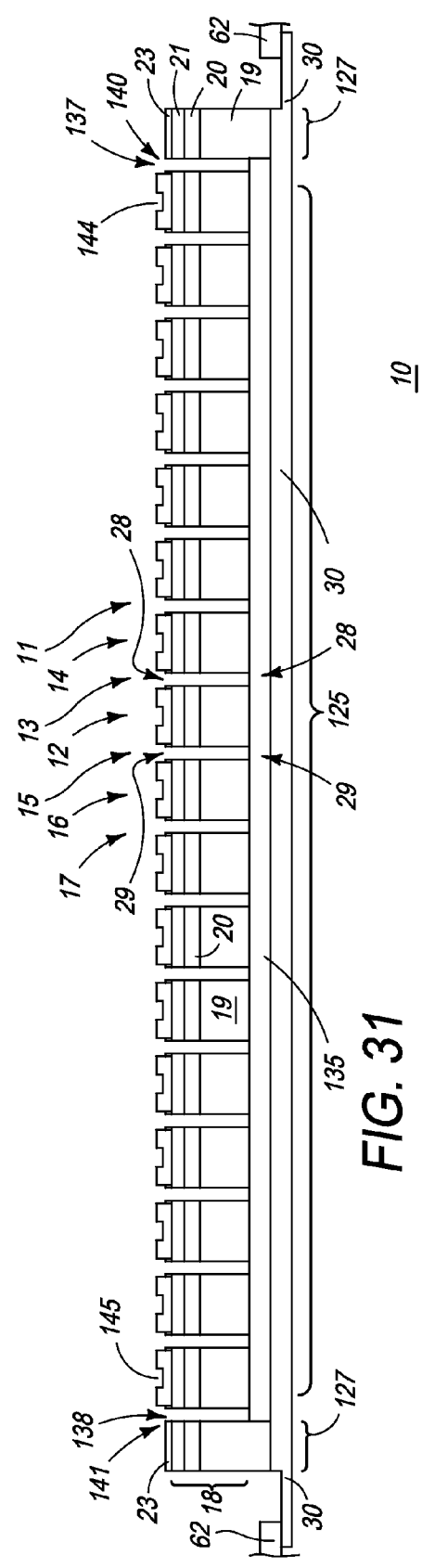

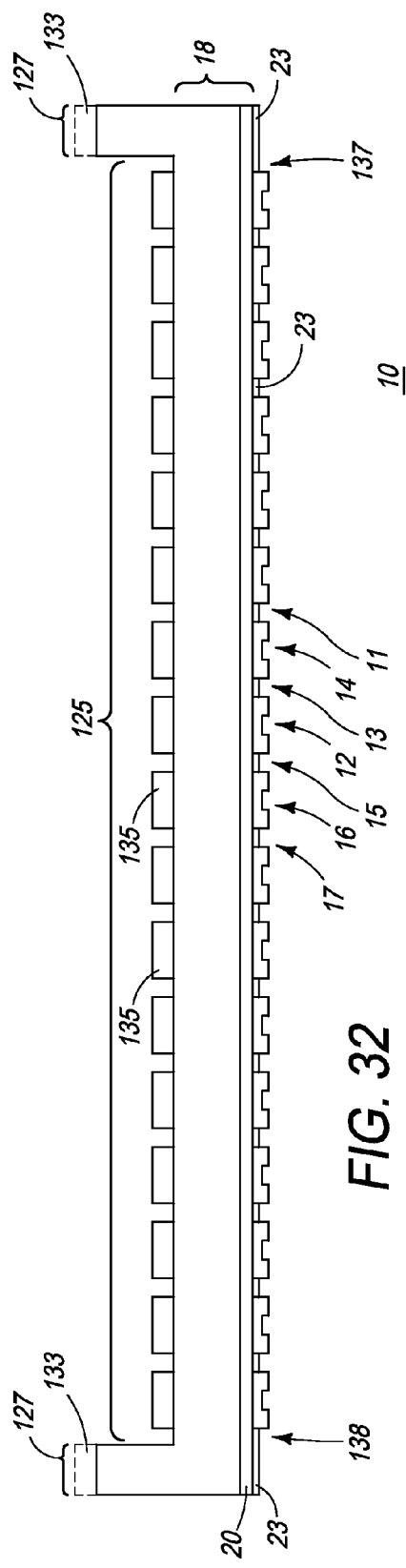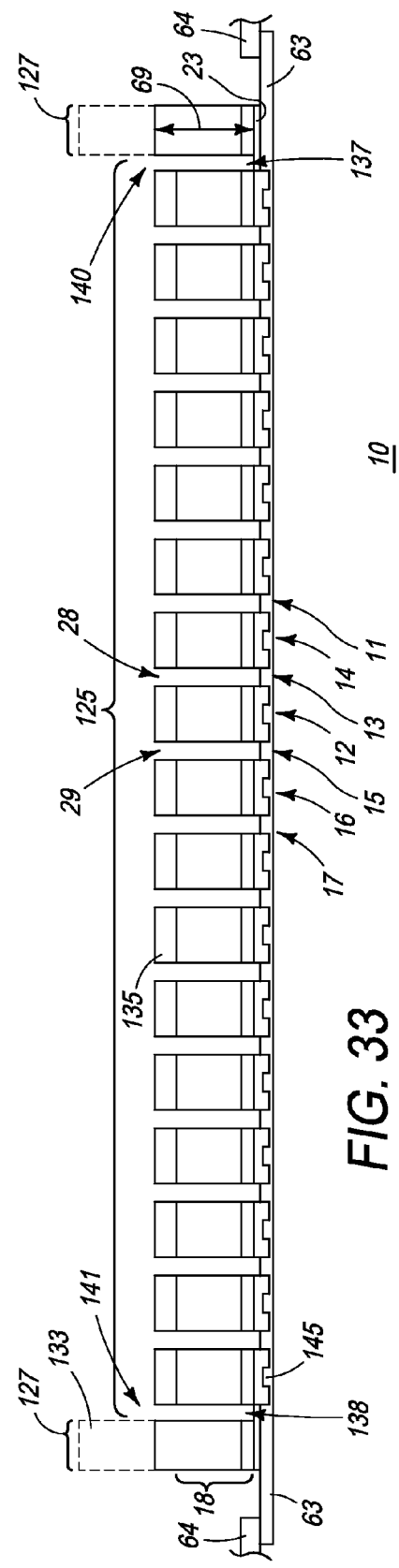

SEMICONDUCTOR DIE SINGULATION METHOD

The present application is a continuation-in-part application of prior U.S. application Ser. No. 11/834,924, filed on Aug. 7, 2007 now U.S. Pat. No. 7,781,310, which is hereby incorporated by reference, and priority thereto for common subject matter is hereby claimed. The present application is also related to a United States patent application entitled SEMICONDUCTOR DIE SINGULATION METHOD, having Gordon Grivna as an inventor, related to a United States patent application entitled METHOD OF FORMING A SEMICONDUCTOR DIE, having Gordon Grivna as an inventor, related to a United States patent application entitled METHOD OF FORMING A SEMICONDUCTOR DIE, having Gordon Grivna as an inventor, related to a United States patent application entitled METHOD OF FORMING AN EM PROTECTED SEMICONDUCTOR DIE, having Michael Seddon as an inventor, and related to a United States patent application entitled METHOD OF FORMING AN EM PROTECTED SEMICONDUCTOR DIE, having Michael Seddon as an inventor, all of which are filed concurrently herewith, have at least one common inventor, a common assignee, and are hereby incorporated herein by reference.

BACKGROUND OF THE INVENTION

The present invention relates, in general, to electronics, and more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel or a wafer saw along scribe grids that were formed on the wafer between the individual die. To allow for the alignment and the width of the cutting tool, each scribe grid usually had a large width, generally about one hundred fifty (150) microns, which consumed a large portion of the semiconductor wafer. Additionally, the time required to scribe all of the scribe grids on the entire semiconductor wafer could take over one hour. This time reduced the throughput and manufacturing capacity of a manufacturing area.

Another method of singulating individual semiconductor die used lasers to cut through the wafers along the scribe grids. However, laser scribing was difficult to control and also resulted in non-uniform separation. Laser scribing also required expensive laser equipment as well as protective equipment for the operators. Also, laser scribing is reported to decrease the strength of a die because the laser melts the crystalline structure along the edge of the die during singulation.

Accordingly, it is desirable to have a method of singulating die from a semiconductor wafer that increases the number of semiconductor die on the wafer, that provides more uniform singulation, that reduces the time to perform the singulation, and that has a narrower scribe line.

BRIEF DESCRIPTION OF THE DRAWINGS

FIG. 24-FIG. 28 illustrate cross-sectional views of various stages of an example embodiment of another method of singulating die from the semiconductor wafer of FIG. 1 in accordance with the present invention;

FIG. 29-FIG. 31 illustrate cross-sectional views of various stages of another alternate embodiment of an example of a method of singulating die from the semiconductor wafer of FIG. 1 in accordance with the present invention; and FIG. 32-FIG. 33 illustrate cross-sectional views of various stages of an example embodiment of another alternate method of singulating die from the semiconductor wafer of FIG. 1 in accordance with the present invention.

For simplicity and clarity of the illustration, elements in the figures are not necessarily to scale, and the same reference numbers in different figures denote the same elements. Additionally, descriptions and details of well-known steps and elements are omitted for simplicity of the description. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles. It will be appreciated by those skilled in the art that the use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described.

DETAILED DESCRIPTION OF THE DRAWINGS

Figure 1:
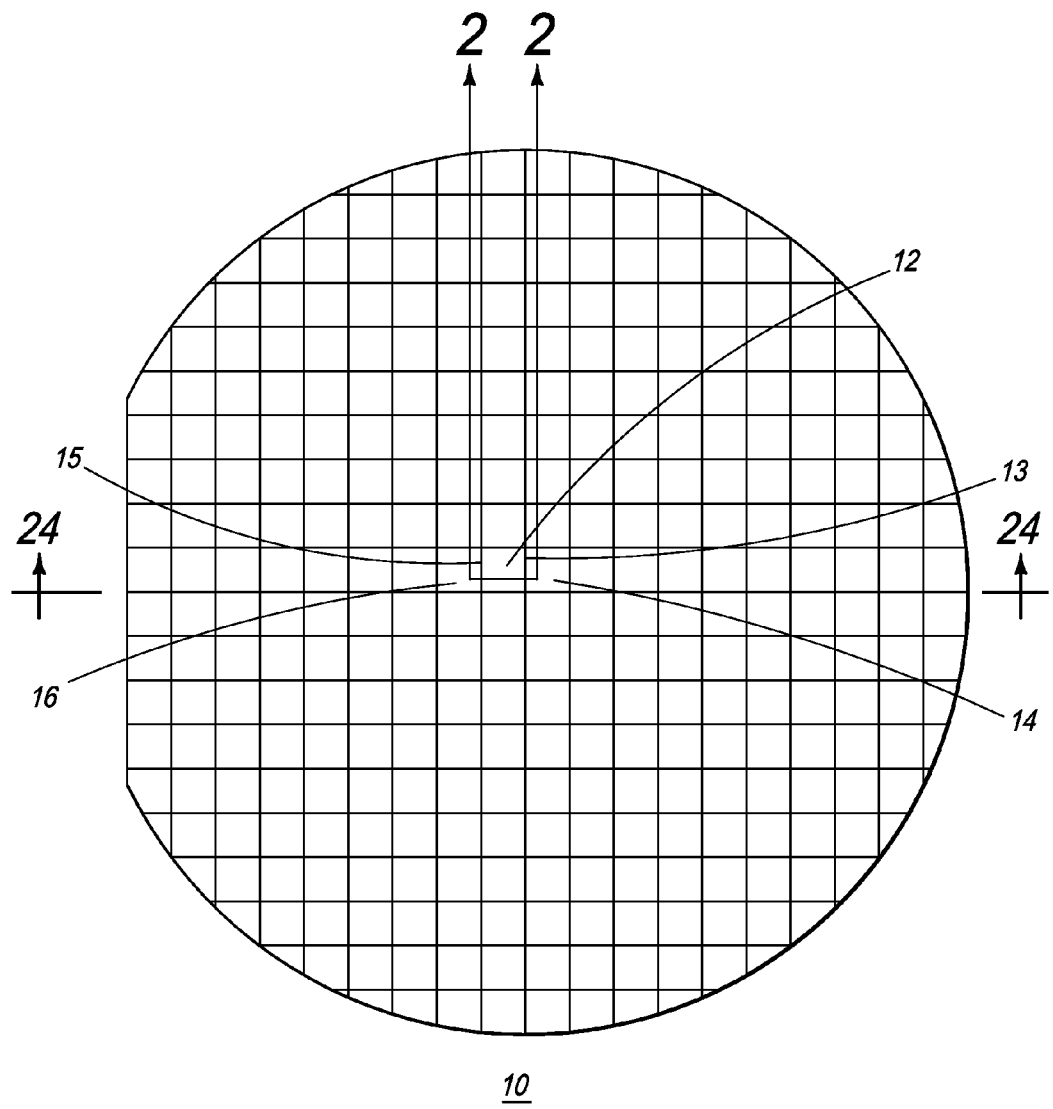
FIG. 1 illustrates a reduced plan view of an embodiment of a semiconductor wafer in accordance with the present invention.

FIG. 1 is a reduced plan view graphically illustrating a semiconductor wafer 10 that has a plurality of semiconductor die, such as die 12, 14, and 16, formed on semiconductor wafer 10. Die 12, 14, and 16 are spaced apart from each other on wafer 10 by spaces in which singulation lines are to be formed, such as singulation lines 13 and 15. As is well known in the art, all of the plurality of semiconductor die generally are separated from each other on all sides by areas where singulation lines such as lines 13 and 15 are to be formed.

Figure 2:
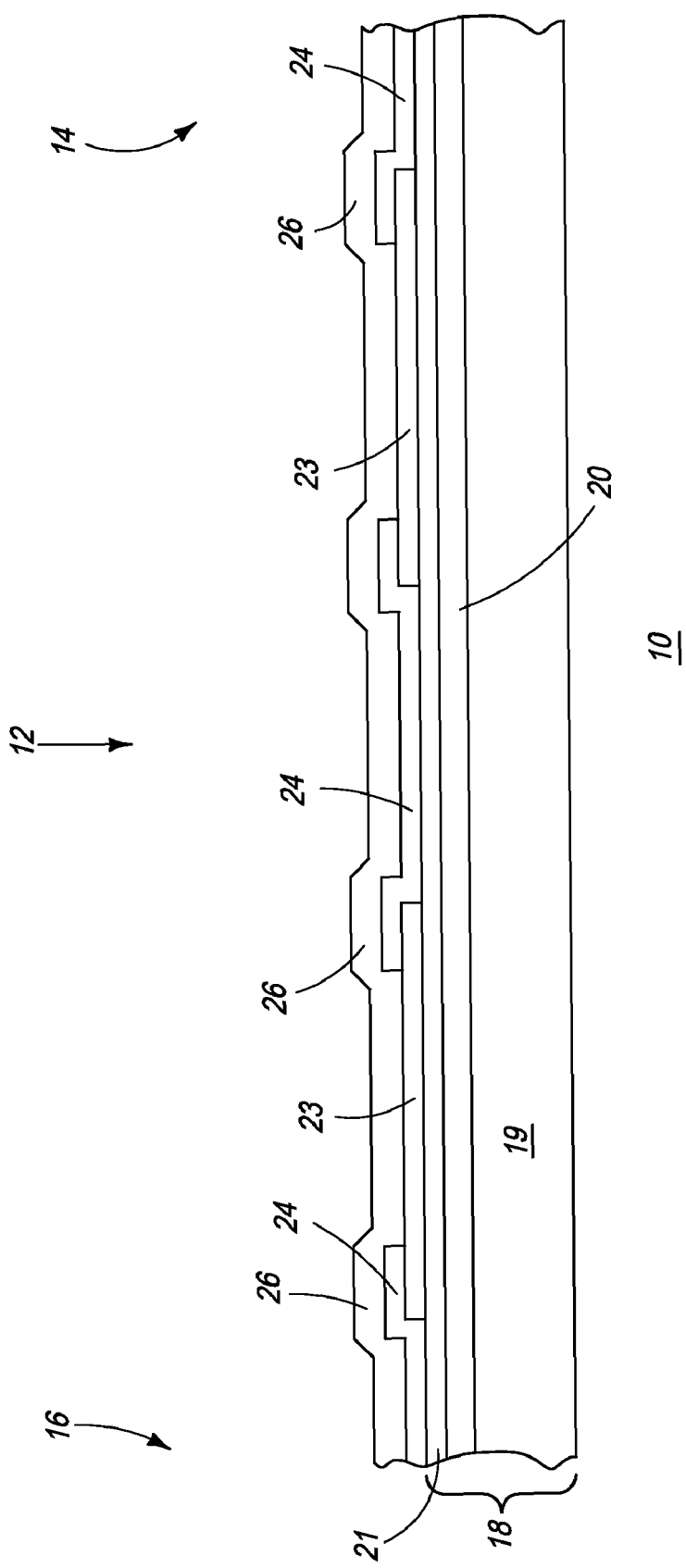
FIG. 2 illustrates an enlarged cross-sectional view of an embodiment of a portion of the semiconductor wafer of FIG. 1 at a stage in a process of singulating die from the wafer in accordance with the present invention.

FIG. 2 illustrates an enlarged cross-sectional portion of wafer 10 of FIG. 1 taken along section line 2-2. For clarity of the drawings and of the description, this section line 2-2 is illustrated to cross-section only die 12 and portions of dice 14 and 16. Die 12, 14, and 16 may be any type of semiconductor die including a diode, a vertical transistor, a lateral transistor, or an integrated circuit that includes a variety of types of semiconductor devices. Semiconductor dice 12, 14, and 16 generally include a semiconductor substrate 18 that may have doped regions formed within substrate 18 in order to form active and passive portions of the semiconductor die. The cross-sectional portion illustrated in FIG. 2 is taken along a contact pad 24 of each of dice 12, 14, and 16. Contact pad 24 generally is a metal that is formed on the semiconductor die in order to provide electrical contact between the semiconductor die and elements external to the semiconductor die. For example, contact pad 24 may be formed to receive a bonding wire that may subsequently be attached to pad 24 or may be formed to receive a solder ball or other type of interconnect structure that may subsequently be attached to pad 24. Substrate 18 includes a bulk substrate 19 that has an epitaxial layer 20 formed on a surface of bulk substrate 19. A portion of epitaxial layer 20 may be doped to form a doped region 21 that is used for forming active and passive portions of semiconductor die 12, 14, or 16. Layer 20 and/or region 21 may be omitted in some embodiments or may be in other regions of dice 12, 14, or 16. Typically, a dielectric 23 is formed on a top surface of substrate 18 in order to isolate pad 24 from other portions of the individual semiconductor die and to isolate each pad 24 from the adjacent semiconductor die. Dielectric 23 usually is a thin layer of silicon dioxide that is formed on the surface of substrate 18. Contact pad 24 generally is a metal with a portion of contact pad 24 electrically contacting substrate 18 and another portion formed on a portion of dielectric 23. After dice 12, 14, and 16 are formed including the metal contacts and any associated inter-layer dielectrics (not shown), a dielectric 26 is typically formed over all of the plurality of semiconductor die to function as a passivation layer for wafer 10 and for each individual semiconductor die 12, 14, and 16. Dielectric 26 usually is formed on the entire surface of wafer 10 such as by a blanket dielectric deposition and in some embodiments may be formed underneath contact pad 24. The thickness of dielectric 26 generally is greater than the thickness of dielectric 23.

Figure 3:
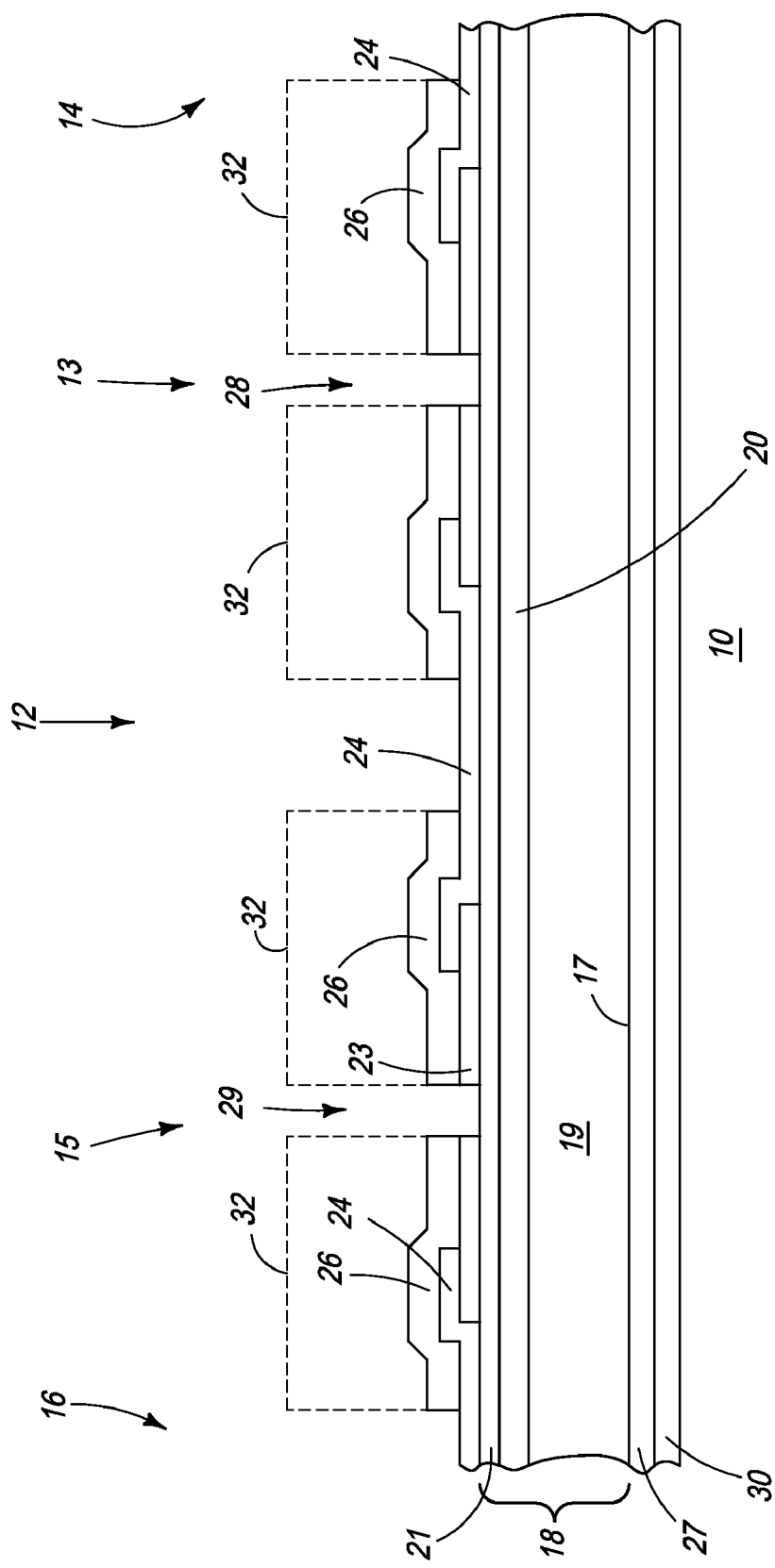
FIG. 3 illustrates a subsequent state in the process of singulating the die from the wafer of FIG. 1 in accordance with the present invention.

FIG. 3 illustrates the cross-sectional portion of wafer 10 in FIG. 2 at a subsequent stage in the process of singulating dice 12, 14, and 16 from wafer 10. After the passivation layer of dielectric 26 is formed, a mask 32, illustrated by dashed lines, may be applied to the surface of substrate 18 and patterned to form openings that expose portions of dielectric 26 overlying each pad 24 and also overlying portions of wafer 10 where the singulation lines, such as singulation lines 13 and 15, are to be formed. Thereafter, dielectrics 26 and 23 are etched through the openings in mask 32 to expose the underlying surface of pads 24 and of substrate 18. The openings that are formed through dielectrics 26 and 23 in the region where the singulation lines, such as lines 13 and 15, are to be formed function as singulation openings 28 and 29. The openings that are formed through dielectric 26 overlying pads 24 function as contact openings. The etching process preferably is performed with a process that selectively etches dielectrics faster than it etches metals. The etching process generally etches dielectrics at least ten (10) times faster that it etches metals. The material used for substrate 18 preferably is silicon and the material used for dielectric 26 preferably is silicon dioxide or silicon nitride. The material of dielectric 26 may also be other dielectric materials that can be etched without etching the material of pads 24, such as polyimide. The metal of pads 24 functions as an etch stop that prevents the etching from removing the exposed portions of pads 24. In the preferred embodiment, a fluorine based anisotropic reactive ion etch process is used.

After forming the openings through dielectric 26, mask 32 is removed and substrate 18 is thinned to remove material from a bottom surface 17 of substrate 18 and reduce the thickness of substrate 18. Generally, substrate 18 is thinned to a thickness that is no greater than about one hundred to two hundred (100 to 200) microns. Such thinning procedures are well known to those skilled in the art. After wafer 10 is thinned, the bottom surface of wafer 10 including bottom surface 17 of substrate 18 may be metalized with a metal layer 27. This metalization step may be omitted in some embodiments. Subsequently, wafer 10 usually is attached to a transport tape or carrier tape 30 that facilitates supporting the plurality of die after the plurality of die are singulated. Such carrier tapes are well known to those skilled in the art.

Figure 4:
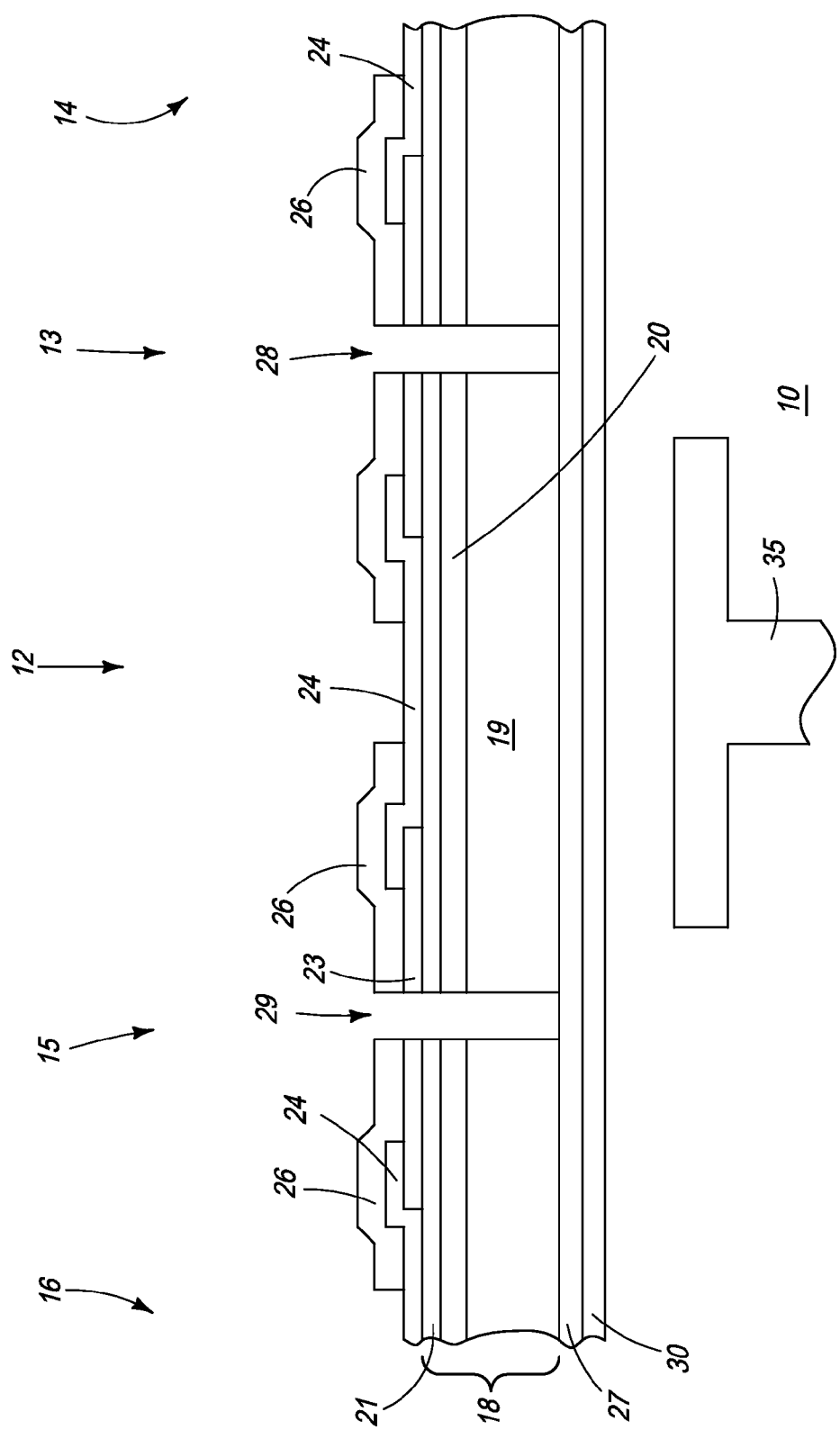
FIG. 4 illustrates another subsequent stage in the process of singulating the die from the wafer of FIG. 1 in accordance with the present invention.

FIG. 4 illustrates wafer 10 at a subsequent stage in the process of singulating semiconductor die 12, 14, and 16 from wafer 10. Substrate 18 is etched through singulation openings 28 and 29 that were formed in dielectric 26. The etching process extends singulation opening 28 and 29 from the top surface of substrate 18 completely through substrate 18. The etching process usually is performed using a chemistry that selectively etches silicon at a much higher rate than dielectrics or metals. The etching process generally etches silicon at least fifty (50) and preferably one hundred (100) times faster than it etches dielectrics or metals. Typically, a deep reactive ion etcher system which uses a combination of isotropic and anisotropic etching conditions is used to etch openings 28 and 29 from the top surface of substrate 18 completely through the bottom surface of substrate 18. In the preferred embodiment, a process commonly referred to as the Bosch process is used to anisotropically etch singulation openings 28 and 29 through substrate 18. In one example, wafer 10 is etched with the Bosch process in an Alcatel deep reactive ion etch system.

The width of singulation openings 28 and 29 is generally five to ten (5-10) microns. Such a width is sufficient to ensure that openings 28 and 29 can be formed completely through substrate 18 and are narrow enough to form the openings in a short time interval. Typically, openings 28 and 29 can be formed through substrate 18 within a time interval of approximately fifteen to thirty (15 to 30) minutes. Since all of the singulation lines of wafer 10 are formed simultaneously, all of the singulation lines can be formed across wafer 10 within the same time interval of approximately fifteen to thirty (15 to 30) minutes. Thereafter, wafer 10 is supported by carrier tape 30 as wafer 10 is taken to a pick-and-place equipment 35 that is utilized to remove each individual die from wafer 10. Typically, equipment 35 has a pedestal or other tool that pushes each singulated die, such as die 12, upward to release it from carrier tape 30 and up to a vacuum pickup (not shown) that removes the singulated die. During the pick-and-place process, the portion of thin back metal layer 27 that underlies openings 28 and 29 breaks away and is left behind on tape 30.

Figure 5:
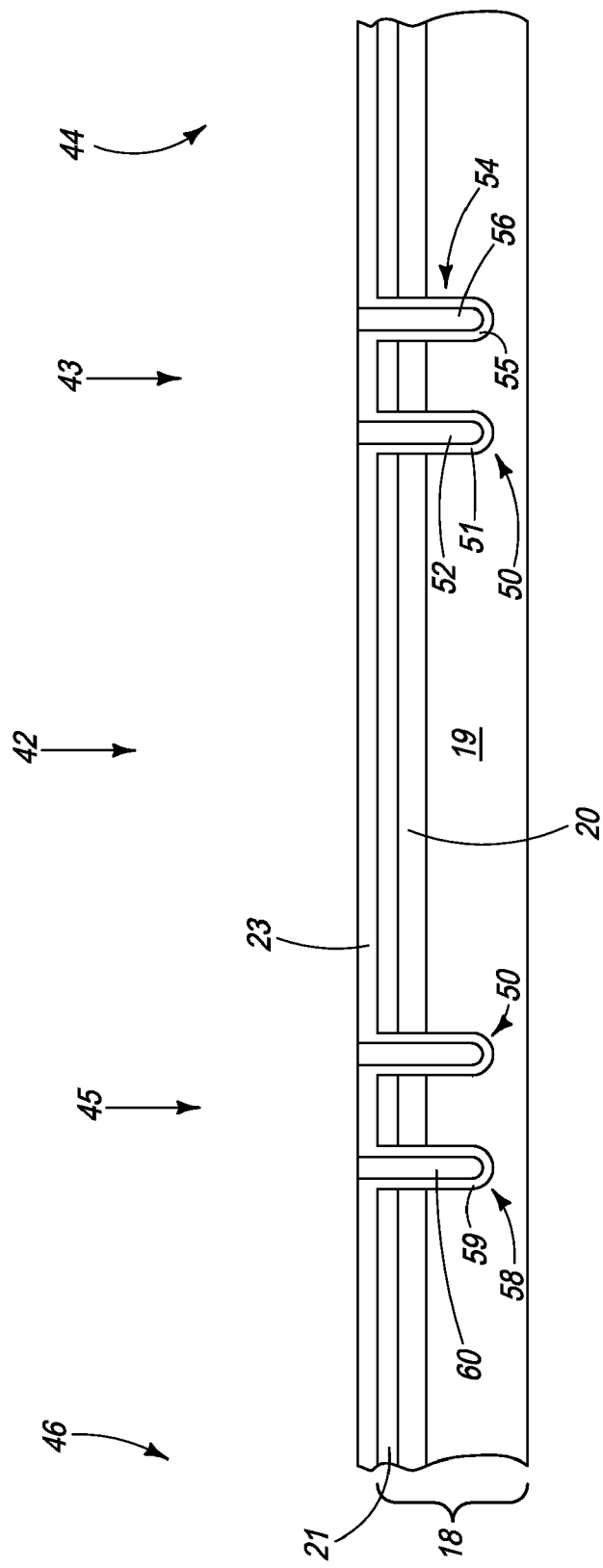
FIG. 5 illustrates an enlarged cross-sectional portion of semiconductor dice that are formed on the wafer of FIGS. 1-4 and that are alternate embodiments of the dice that are explained in the description of FIGS. 1-4.

FIG. 5 illustrates an enlarged cross-sectional portion of semiconductor dice 42, 44, and 46 that are formed on wafer 10 and that are alternate embodiments of dice 12, 14, and 16 that are explained in the description of FIGS. 1-4. Dice 42, 44, and 46 are illustrated at a manufacturing state after forming dielectric 23 on the top surface of substrate 18 and prior to forming pads 24 (FIG. 1). Dice 42, 44, and 46 are similar to dice 12, 14, and 16 except that dice 42, 44, and 46 each have a respective isolation trench 50, 54, and 58 that surround the die and isolate them from an adjacent die. Trenches 50, 54, and 58 generally are formed near an outside edge of each die. Trenches 50, 54, and 58 are formed to extend from the top surface of substrate 18 a first distance into bulk substrate 19. Each trench 50, 54, and 58 generally is formed as an opening into substrate 19 that has a dielectric formed on the sidewall of the opening and generally is filled with a dielectric or other material such as silicon or polysilicon. For example, trench 50 may include a silicon dioxide dielectric 51 on the sidewalls of the trench opening and may be filled with polysilicon 52. Similarly, trenches 54 and 58 include respective silicon dioxide dielectrics 55 and 59 on the sidewalls of the trench opening and may be filled with polysilicon 56 and 60. Singulation line 43 is to be formed between trenches 50 and 54, and singulation line 45 is to be formed between trenches 50 and 58. Trenches 50 and 54 are formed adjacent to singulation line 43, and trenches 50 and 58 are formed adjacent to singulation line 45. Methods of forming trenches 50, 54, and 58 are well known to those skilled in the art. It should be noted that trenches 50 and 54 are used as illustration only and could be any number of shapes, sizes, or combinations of isolation tubs or trenches.

Figure 6:
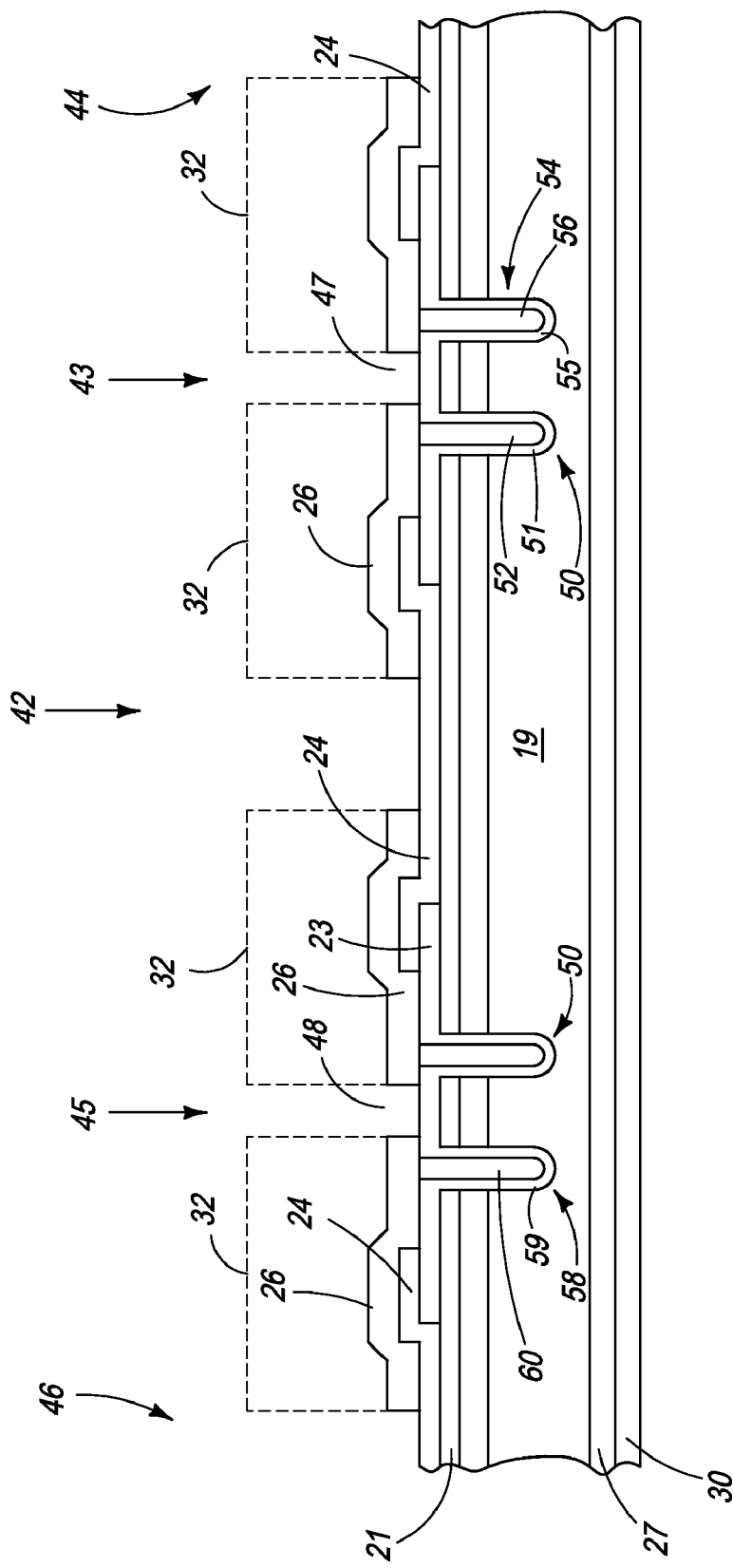
FIG. 6 illustrates a subsequent stage in the process of singulating the die of FIG. 5 in accordance with the present invention.

FIG. 6 illustrates wafer 10 at a subsequent stage in the process of singulating semiconductor dice 42, 44, and 46 from wafer 10. After trenches 50, 54, and 58 are formed, other portions of dice 42, 44, and 46 are formed including forming contact pads 24 and forming dielectric 26 covering dice 42, 44, and 46. Dielectric 26 generally also covers other portions of wafer 10 including the portion of substrate 18 where singulation lines 43 and 45 are to be formed. Thereafter, mask 32 is applied and patterned to expose underlying dielectric 26 where singulation lines and contact openings are to be formed. Dielectric 26 is etched through the openings in mask 32 to expose the underlying surface of pads 24 and of substrate 18. The openings that are formed through dielectric 26 in the region where the singulation lines, such as lines 43 and 45, are to be formed function as singulation openings 47 and 48. The etching process used to form openings 47 and 48 through dielectrics 23 and 26 is substantially the same as the process used to form openings 28 and 29 (FIG. 3) in dielectric 23 and 26. Openings 47 and 48 preferably are formed so that dielectrics 51, 55, and 59 on the sidewalls of respective trenches 50, 54, and 58 are not underlying openings 47 and 48 so that the dielectrics will not be affected in subsequent operations to form singulation lines 43 and 45.

After forming openings 47 and 48 through dielectric 26, mask 32 is removed and substrate 18 is thinned and metalized with metal layer 27 as explained hereinbefore in the description of FIG. 3. This metalization step may be omitted in some embodiments. After metalization, wafer 10 is usually attached to carrier tape 30.

Figure 7:
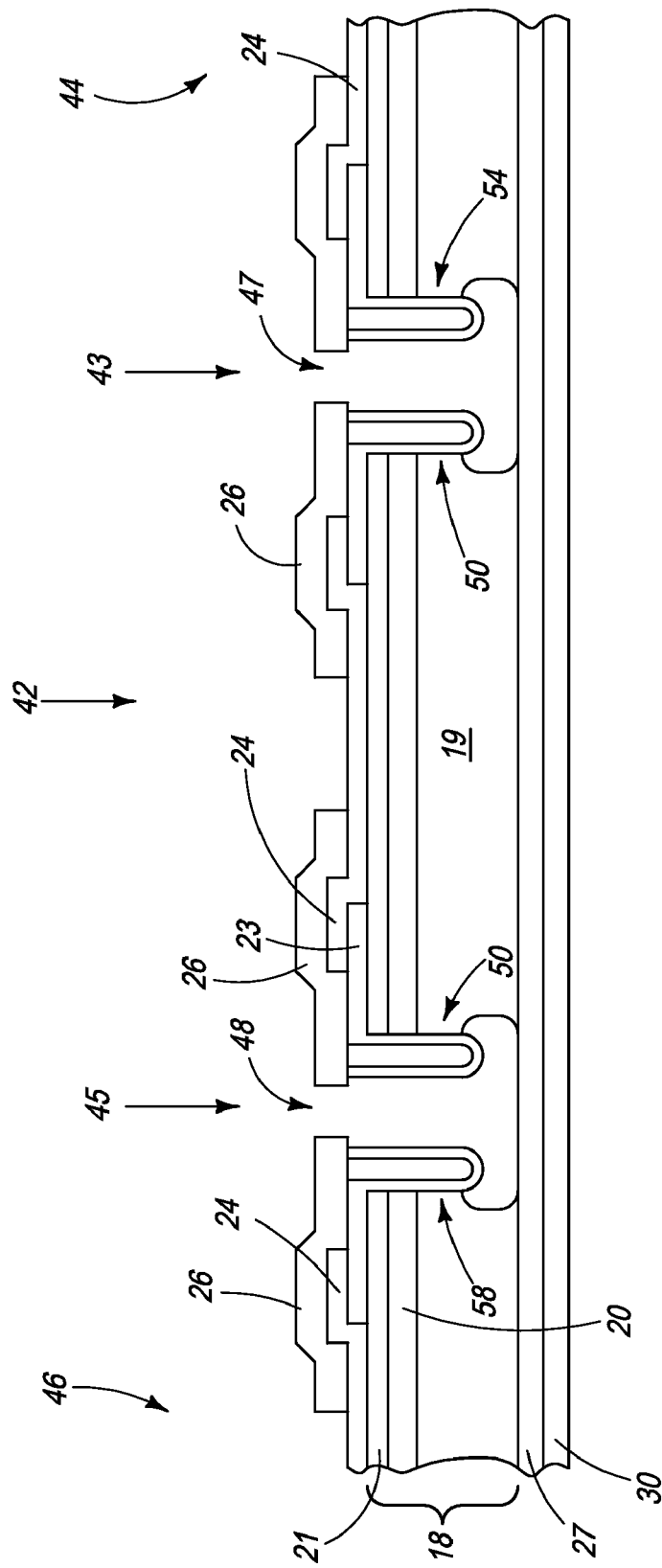
FIG. 7 illustrates another subsequent stage in the process of singulating the die of FIG. 6 in accordance with the present invention.

FIG. 7 illustrates wafer 10 at a subsequent stage in the process of singulating semiconductor die 42, 44, and 46 from wafer 10. Substrate 18 is etched through singulation openings 47 and 48 that were formed in dielectric 26. The etching process extends singulation opening 47 and 48 from the top surface of substrate 18 completely through substrate 18. Openings 47 and 48 usually are at least 0.5 microns from dielectrics 51, 55, and 59. The etching process usually is an isotropic etch that selectively etches silicon at a much higher rate than dielectrics or metals, generally at least fifty (50) and preferably at least one hundred (100) times faster. Since the dielectric on the sidewalls of the trenches protects the silicon of substrate 18, an isotropic etch can be used. The isotropic etch has a much higher etching throughput than can be obtained with the use of the Bosch process or with limited use of the Bosch process. However, the isotropic etching typically undercuts portions of substrate 19 that are underlying trenches 50, 54, and 58. Typically, a down-stream etcher with a fluorine chemistry is used to etch openings 28 and 29 from the top surface of substrate 18 completely through the bottom surface of substrate 18 and expose a portion of layer 27 underlying openings 28 and 29. In one example, wafer 10 is etched in a deep reactive ion etch system using full isotropic etching available from various manufactures including one available from PlasmaTherm, LLC of 10050 16th Street North St. Petersburg, Fla. 33716. In other embodiments, isotropic etching may be used for most of the etching and anisotropic etching may be used for another portion of the etching (the Bosch process). For example, isotropic etching may be used until openings 28 and 29 extend to a depth that is substantially the same depth as trenches 50, 54, and 58, and anisotropic etching may be used thereafter to prevent the undercutting of trenches 50, 54, and 58.

The width of singulation openings 47 and 48 is generally about the same as the width of openings 28 and 29. Dice 42, 44, and 46 may be removed from tape 30 similarly to the manner of removing dice 12, 14, and 16.

In another embodiment, trenches 50 and 58 may be spaced apart a distance that is sufficient to allow a standard scribing tool or a wafer saw to extend through opening 48. Thus, the portion of layer 27 that underlies opening 48 may be severed by the scribe tool or wafer saw or bent over rollers in order to crack wafer 10 under openings 47 and 48 to separate along openings 47 and 48, or removed with other techniques such as laser scribing, etc. Trenches 50 and 54 may have similar spacings that facilitate severing the underlying portion of layer 27 in a similar manner. For the method of using a scribe tool to scribe layer 27, layer 27 may be broken along the path of the scribe tool to complete the separation. Thereafter, dice 42, 44, and 46 may be removed from tape 30 by standard pick and place techniques. These methods facilitate separating and singulating dice 42, 44, and 46.

Alternately, the isotropic etching may be terminated when the depth of openings 47 and 48 reach the bottom of trenches 50, 54, and 58 or just past the bottom of the trenches. Thereafter, the exposed portion of substrate 19 may be scribed with a scribe tool or sawed with a wafer saw to complete the separation of the die or removed with other techniques such as laser cutting, etc. The sawing technique may be extended to saw through metal layer 27. The scribing technique would break layer 27 when the material of substrate 19 is broken along the path formed by the scribe tool.

Those skilled in the art will appreciate that using trenches 50, 54, and 58 to singulate the die results in die 42, 44, and 46 having smooth sidewalls that are isolated from elements external to the die by the dielectric sidewalls of the trenches. This dielectric forms a dielectric material on the sidewalls of the die. The isolation provided by the dielectric of the trenches can reduce leakage current between the die and external elements. The structure can also improve the breakdown voltage of the die. Using trenches 50, 54, and 58 can also increase die strength over laser die singulation methods.

Referring again to the etch technique used to extend openings 47 and 48 into substrate 19, those skilled in the art will appreciate that the isotropic etch etches faster than the anisotropic etch, thus, using the isotropic etch until openings 47 and 48 are extended to a depth that is as deep as trenches 50, 54, and 58, quickly removes the material of the openings. Subsequently using the anisotropic etch prevents undercutting trenches 50, 54, and 58. Thus, using the isotropic etch followed by the anisotropic etch provides a high throughput and good lateral control even for the portion of openings 47 and 48 that is deeper than trenches 50, 54, and 58.

Figure 8:
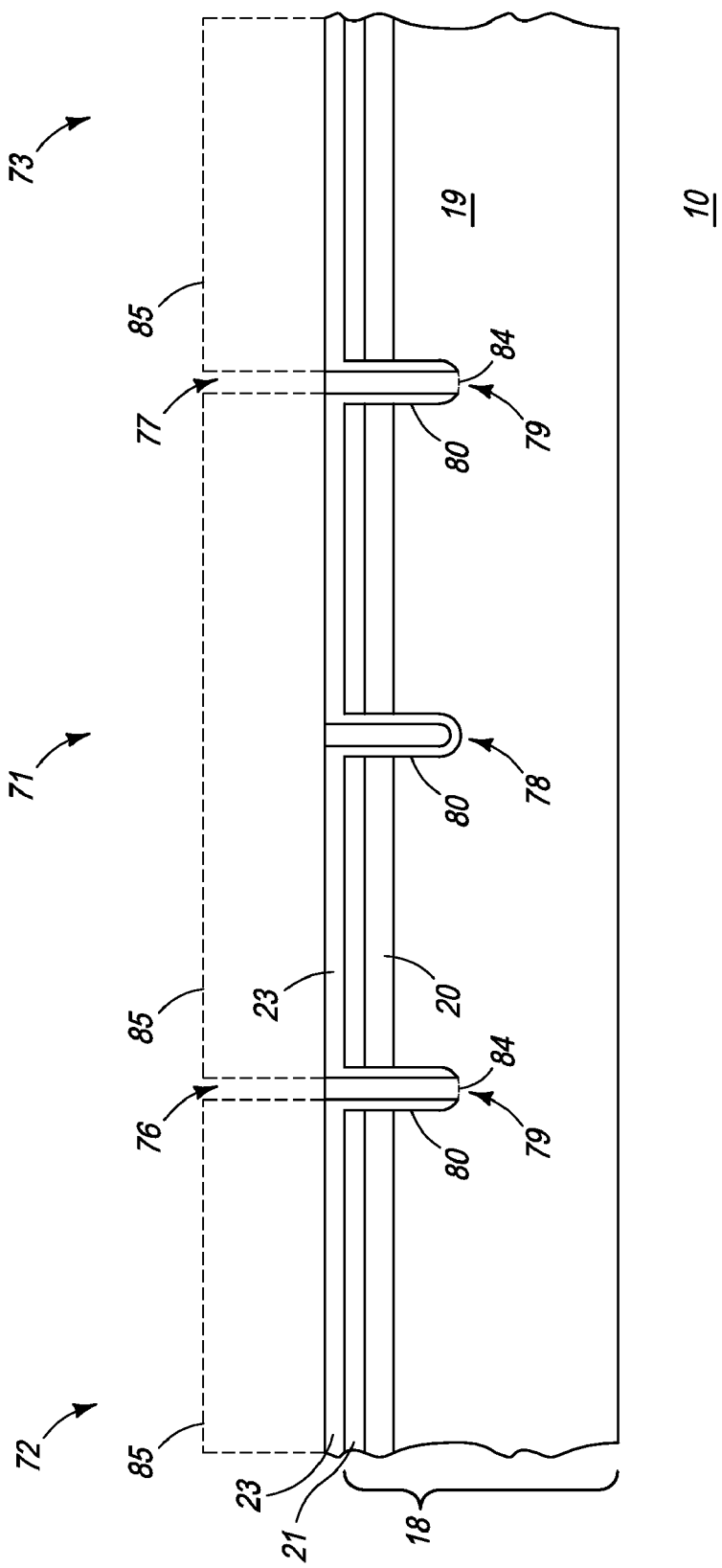
FIG. 8-FIG. 10 illustrate steps in an example embodiment of another method of singulating die from the semiconductor wafer of FIG. 1 in accordance with the present invention.

FIG. 8 illustrates a stage in an example embodiment of another alternate method of singulating semiconductor dice 71, 72, and 73 that are formed on semiconductor wafer 10. FIG. 8 illustrates an enlarged cross-sectional portion of dice 71-73 at a manufacturing state after forming dielectric 23 on the top surface of substrate 18 and prior to forming pads 24 (FIG. 2). Dice 71-73 are similar to dice 42, 44, and 46 except that dice 71-73 have a single isolation trench 79 that surrounds each die on wafer 10.

As will be seen further hereinafter one example of a method of singulating semiconductor die from wafer 10 comprises: providing semiconductor wafer, such as wafer 10, having a semiconductor substrate, substrate 18 for example, and also having a plurality of semiconductor die formed on the semiconductor substrate wherein the semiconductor die are separated from each other by portions of the semiconductor wafer and wherein the portions of the semiconductor wafer are in positions where singulation lines, such as lines 13 and 15, are to be formed; forming a trench, such as trench 79 in the portions of the semiconductor wafer wherein the trench surrounds a perimeter of each of the plurality of semiconductor die including forming a dielectric layer on sidewalls of the trench and a filler material within the trench and abutting the dielectric layer that is on the sidewalls; forming a passivation layer, such as layer 26, overlying portions of the plurality of semiconductor die; etching a first opening, for example opening 82, through the passivation layer and any underlying layers to expose at least the filler material of the trench; and etching a second opening, such as an opening 81, through the filler material and through any portion of the semiconductor substrate that is underlying the filler material so that the second opening extends from the surface of the semiconductor wafer completely through the semiconductor substrate wherein the etching of the second opening is performed through the first opening.

Another embodiment of the method also includes forming a trench opening that extends from the surface of the semiconductor substrate a first distance into the semiconductor substrate wherein a first portion of the semiconductor substrate underlies the trench opening and wherein the trench opening has sidewalls and a bottom; forming the dielectric layer on the sidewalls of the trench opening and on the bottom of the trench opening and leaving a portion of the trench opening that is between the sidewalls as a vacant space; removing the dielectric on the bottom of the trench opening; and filling the vacant space of the trench opening with the filler material abutting the dielectric layer that is on the sidewalls of the trench.

Trench 79 is formed similarly to any of trenches 50, 54, or 58 that were explained in the description of FIGS. 5-7, except that trench 79 is extended to surround the perimeter of each of dice 71-73 and any other die formed on wafer 10. Trench 79 is formed to include a dielectric liner 80, such as silicon dioxide, that is on the sidewalls and bottom of trench 79. In the preferred embodiment, the bottom of dielectric liner 80 is removed so that the bottom of trench 79 is open as illustrated by a dashed line 84. One example method of removing the bottom of liner 80 includes applying a mask 85 having openings that exposes trench 79 and performing an anisotropic etch, such as a spacer etch, that etches through the bottom of liner 80. The etch may be selective to dielectrics over silicon in order to prevent damaging the portion of substrate 18 that is underlying trench 79. Mask 85 generally is removed after the bottom of liner 80 is removed. After removing the bottom of trench 79, the remaining opening of trench 79 is filled with a filler material 81. Filler material 81 generally is a silicon based material, such as polysilicon, in order to facilitate subsequent process steps as will be seen further hereinafter.

Those skilled in the art will appreciate that any of dice 71-73 may also have other trenches, such as a trench 78, internal to the die and that these trenches may be formed using process operations similar to those used to form trench 79. Trench 78 may retain the bottom oxide or have the bottom oxide removed depending upon the function that it will serve. For example, trench 78 may be filled with doped polysilicon and provide a low resistance substrate contact or a backside contact such as to metal layer 27 (not shown in FIG. 8) or to another contact on the bottom or backside of substrate 18. However, the preferred embodiment of trench 78 does not have the bottom removed and trench 78 preferably is internal to the die and does not surround the outside perimeter of the die. Thus, trench 79 may be formed at the same time as trench 78, or other similar trench, thereby reducing manufacturing costs. As will be understood by those skilled in the art, die 71-73 may have various active and or passive elements formed on or within substrate 18.

Trench 79 is formed within singulation lines 76 and 77 and preferably in the middle of the singulation lines such that the middle of trench 79 is approximately in the middle of the singulation line. As will be seen further hereinafter, singulation will occur approximately through the middle of trench 79.

Figure 9:
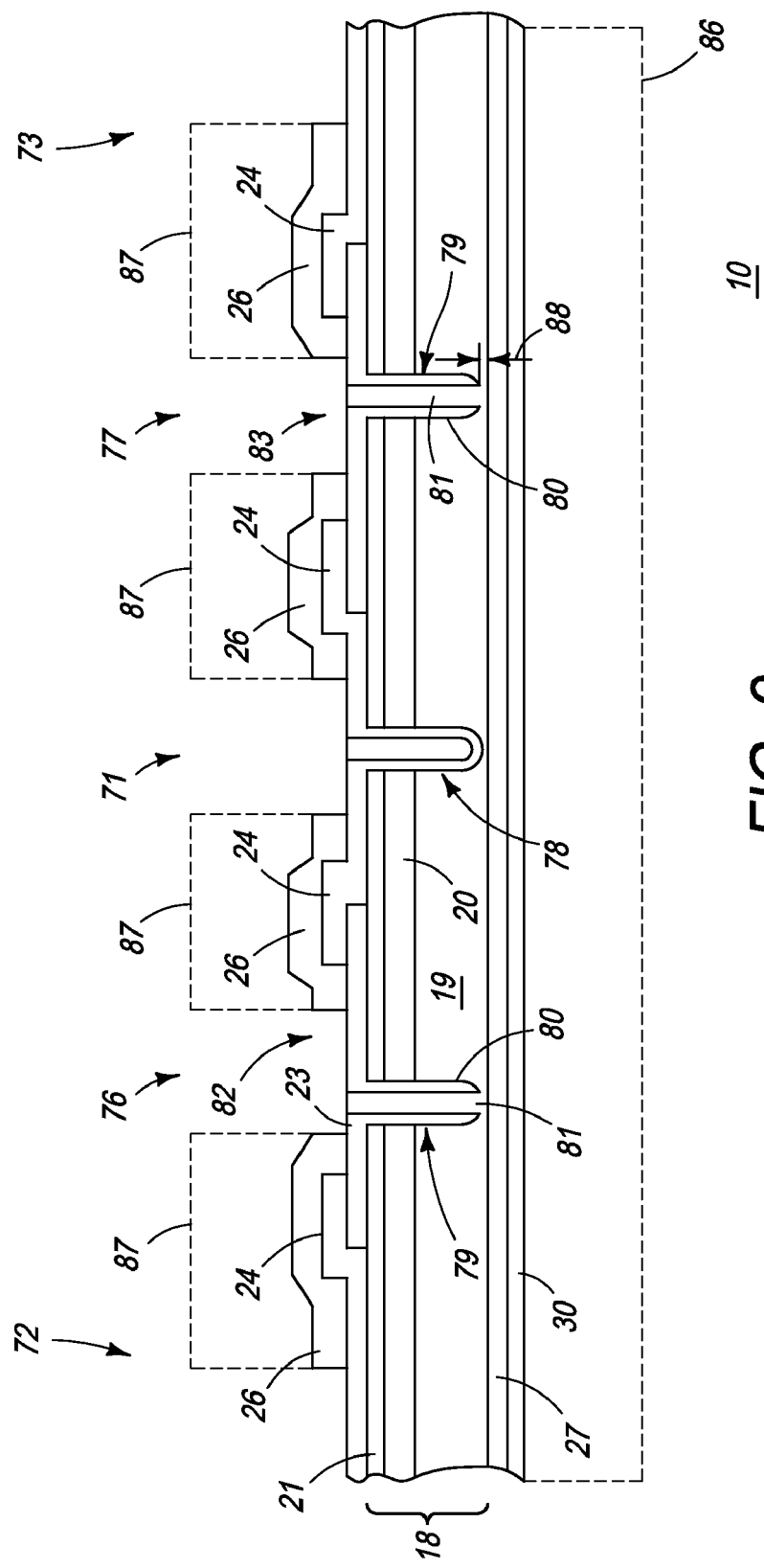

FIG. 9 illustrates wafer 10 at a subsequent stage in the example method of singulating semiconductor die 71-73 from wafer 10. After trench 79 is formed, other portions of dice 71-73 are formed including forming contact pads 24 and forming dielectric 26 covering dice 71-73. Dielectric 26 generally also covers other portions of wafer 10 including the portion of substrate 18 where singulation lines 77 and 76 are to be formed. Thereafter, a mask 87 is applied and patterned to expose underlying dielectric 26 where singulation lines 76 and 77, and contact openings are to be formed. Mask 87 is similar to mask 32 that is illustrated in FIG. 3; however, mask 87 usually has a slightly different position. The openings in mask 87 where singulation lines 76 and 77 are to be formed also overlie trench 79. Dielectric 26 is etched through the openings in mask 87 to expose underlying filler material 81 that is within trench 79. The etching also typically exposes underlying pads 24. The openings that are formed through dielectric 26 in the region where the singulation lines, such as lines 76 and 77, are to be formed function as singulation openings 82 and 83. The etching process used to form openings 82 and 83 through dielectric 26 is substantially the same as the process used to form openings 28 and 29 (FIG. 3) in dielectric 23 and 26. Openings 82 and 83 typically are formed so that dielectric liner 80 on the sidewalls of corresponding trench 79 is underlying openings 82 and 83, although dielectric liner 80 does not have to be exposed as long as material 81 is exposed. Openings 82 and 83 are typically two portions of a single opening that surrounds die 71-73 but are illustrated as two openings because of the cross-sectional view.

After forming openings 82 and 83 through dielectric 26, mask 87 is removed, as illustrated by the dashed lines, and substrate 18 is thinned as illustrated by a dashed line 86. The thinning removes most of substrate 18 that is underlying trench 79. Substrate 18 generally is not thinned all the way up to the bottom of trench 79 because the dielectric material of dielectric liner 80 may damage the tool used to thin wafer 10 or may result in scratching wafer 10. Preferably, substrate 18 is thinned until trench 79 is about two to five (2-5) microns from the bottom to substrate 18. In some embodiments, substrate 18 may be thinned until the bottom of trench 79 is exposed. Thereafter, the bottom surface of substrate 18 is metalized with metal layer 27 as explained hereinbefore in the description of FIG. 3. This metalization step may be omitted in some embodiments. Subsequently, wafer 10 is usually attached to a common carrier substrate or common carrier, such as carrier tape 30.

Figure 10:
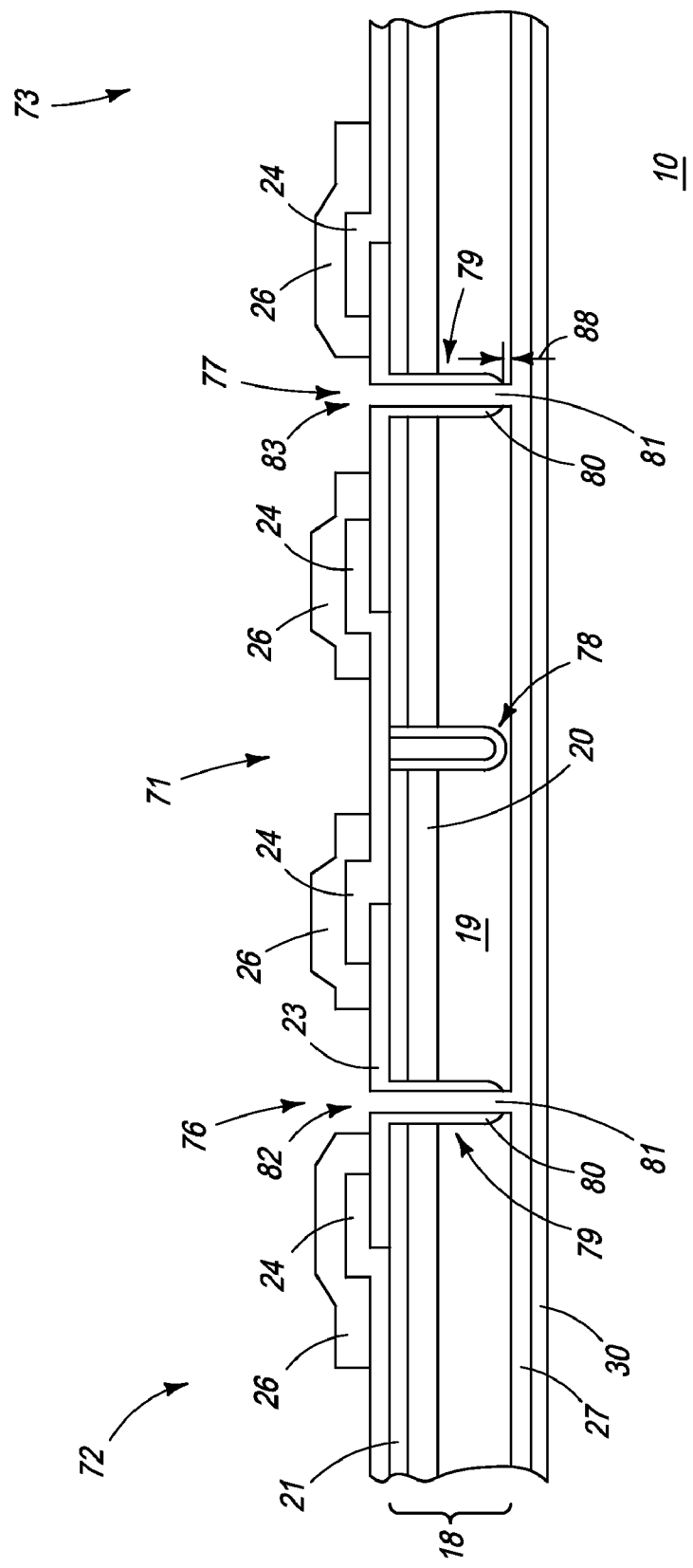

FIG. 10 illustrates wafer 10 at a subsequent stage in an example of an embodiment of the method of singulating die 71-73 from wafer 10. A second opening is formed through filler material 81 to form singulation lines 76 and 77 through substrate 18. Substrate 18 preferably is etched through singulation openings 82 and 83 using dielectric 26 as a mask similar to the etching explained in the description of FIG. 4. The etching process forms an opening through material 81. Typically, the etching removes substantially all of material 81 to extend singulation lines 76 and 77 from the top surface of substrate 18 completely through filler material 81 of trench 79. The etching process usually is an isotropic etch that selectively etches silicon at a much higher rate than dielectrics or metals, generally at least fifty (50) and preferably at least one hundred (100) times faster. Since the etching step is selective to silicon over dielectrics, filler material 81 is removed without etching dielectric liner 80 on the sidewalls of trench 79. Thus, dielectric liner 80 on the sidewalls of trench 79 protects the silicon of substrate 18 from the isotropic etch. The isotropic etch has a much higher etching throughput than can be obtained with the use of the BOSCH process or with limited use of the Bosch process. The isotropic etching process etches through filler material 81 and any portion of substrate 18 that underlies trench 79. Thus, the isotropic etch quickly etches through trench 79 and any underlying portion of substrate 18 thereby singulating die 71-73. The rapid etching improves throughput and reduces the manufacturing costs. Those skilled in the art will appreciate that the silicon based material of filler material 81 also reduces stress on the material of dielectric liner 80 and substrate 19.

Singulating dice 71-73 along singulation lines 76 and 77 through trench 79 results in the singulation line occupying a very small space of a semiconductor wafer. For example, the width of trench 79 including filler material 81 typically is only about three (3) microns wide. Thus, singulation lines 76 and 77 may be only about three microns wide instead of one hundred microns wide in other methods of singulating die, such as scribing or wafer sawing. It will be apparent to those skilled in the art that the step of thinning wafer 10 may be omitted and the etching of material 81 may be continued until openings 82 and 83 are extended through wafer 10.

As explained in the description of FIG. 4, a pick-and-place tool may be used to break any portion of metal layer 27 that underlies openings 82 and 83 to complete the singulation of dice 71-73. Those skilled in the art will appreciate that other methods may also be used to sever metal layer 27 within singulation lines 76 and 77. For example, metal layer 27 may be scribed along the bottom side of layer 27 prior to applying tape 30, thus, layer 27 will sever along this line when the pick-and-place is performed. Alternately, the portion of layer 27 underlying singulation lines 76 and 77 may be etched from the back side of layer 27 prior to applying tape 30. The etching of layer 27 singulates layer 27. Another method of severing layer 27 is to blow a jet of air onto the portion of tape 30 that underlies wafer 10. The air will cause tape 30 to stretch upwardly and sever layer 27 in the portion of layer 27 underlying singulation lines 76 and 77. Additionally, a second carrier tape, not shown, may be place on the front side of wafer 10. Then, tape 30 may be removed. The step of removing tape 30 will sever layer 27 in the portion of layer 27 underlying singulation lines 76 and 77. Any of these alternate methods of severing layer 27 may be used for any of the singulation methods described herein.

Figure 11:
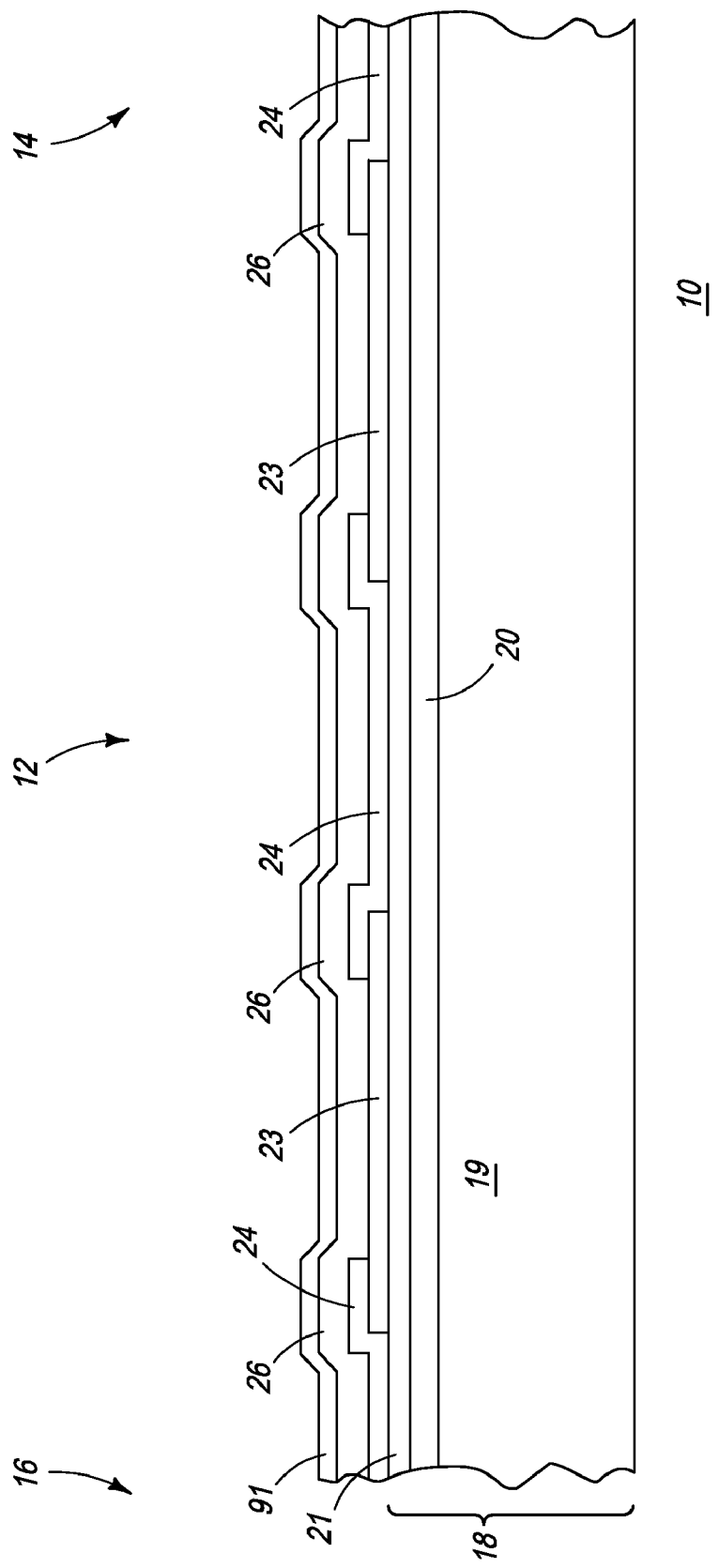
FIG. 11-FIG. 14 illustrate steps in an example embodiment of another method of singulating die from the semiconductor wafer of FIG. 1 in accordance with the present invention.

FIG. 11 illustrates a stage in an example embodiment of another alternate method of singulating semiconductor dice 12, 14, and 16 that were explained in the description of FIGS. 1 and 2-4.

As will be seen further hereinafter, an example of one method of singulating a semiconductor die from a semiconductor wafer comprises: providing a semiconductor wafer having semiconductor substrate, the semiconductor substrate having a first thickness, a top surface, a bottom surface, and a plurality of semiconductor die formed on the semiconductor substrate and separated from each other by portions of the semiconductor wafer where singulation lines are to be formed; forming a singulation mask layer, such as AlN 93, overlying the plurality of semiconductor die; forming an opening through the singulation mask layer; forming an opening through underlying layers and exposing a portion of a surface of the semiconductor substrate; and using the opening in the singulation mask layer as a mask while etching to extend the first opening from the exposed portion of the surface of the semiconductor substrate completely through the semiconductor wafer.

Another embodiment of the method further includes; attaching the semiconductor wafer to a carrier tape prior to the step of using the opening in the singulation mask layer as a mask; and further including using pick-and-place equipment to separate the carrier tape and to separate a semiconductor die of the plurality of semiconductor die from other die of the plurality of semiconductor die.

Yet another embodiment of the method includes, forming the singulation mask layer as a layer that is one of a metal compound, aluminum nitride, titanium nitride, a metal-silicon compound, titanium silicide, aluminum silicide, a polymer, or polyimide.

Dice 12, 14, and 16 are illustrated at a manufacturing state after forming dielectric 23 on the top surface of substrate 18 and subsequent to forming pads 24 and dielectric 26 as explained in the description of FIG. 2. After forming dielectric 26, a singulation mask is formed to facilitate forming openings through substrate 18 without etching underlying layers such as portions of dielectric 26. In the preferred embodiment, the singulation mask is formed from aluminum nitride (AlN). In this preferred embodiment, an AlN layer 91 is formed at least on dielectric 26. Layer 91 generally is applied to cover all of wafer 10.

Figure 12:
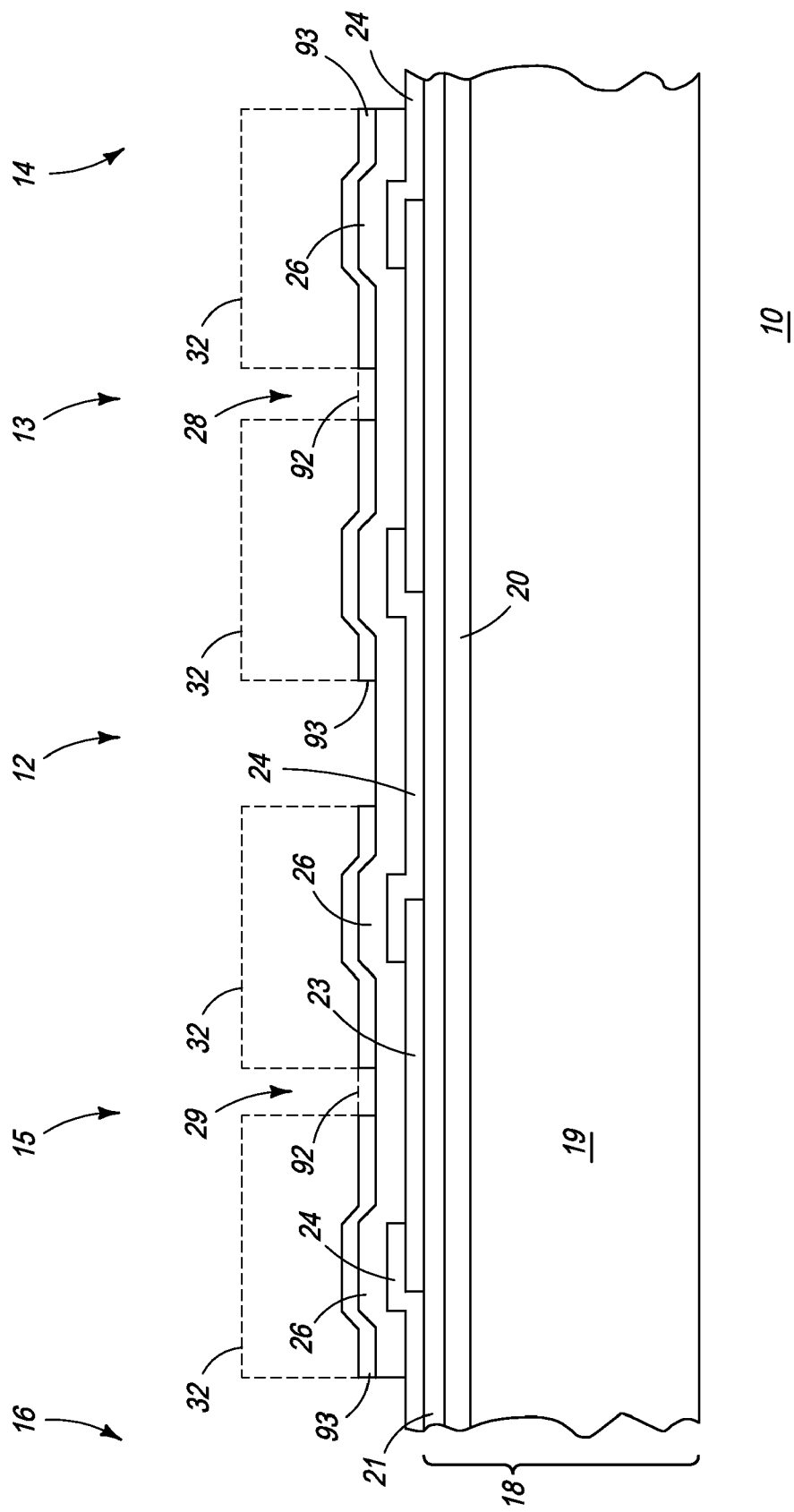

FIG. 12 illustrates the cross-sectional portion of wafer 10 in FIG. 11 at a subsequent stage in the example of a preferred embodiment of a method of singulating dice 12, 14, and 16 from wafer 10. After AlN layer 91 is formed, mask 32 may be applied to the surface of substrate 18 and patterned to form openings that expose portions of dielectric 26 overlying each pad 24 and also overlying portions of wafer 10 where the singulation lines, such as singulation lines 13 and 15, are to be formed.

In order to form mask 32, a photographic mask material is applied to wafer 10 and then exposed to light, such as ultraviolet light, to change the chemical composition of the exposed portion of the mask material in order to form mask 32 having openings overlying the location where the singulation lines are to be formed and also where pads 24 are to be formed. A developer solution is then used to remove the unexposed portions of the mask material thereby leaving mask 32 with openings 28 and 29 overlying the location where respective singulation lines 13 and 15 are to be formed. It has been found that using an ammonium hydroxide based developer solution also results in the developer solution removing the portion of AlN layer 91 that underlies the unexposed portions of the mask material. The removed portion of layer 91 is illustrated by dashed lines 92, and the remaining portions of layer 91 are identified as AlN 93. AlN 93 functions as a singulation mask as will be seen further hereinafter.

Figure 13:
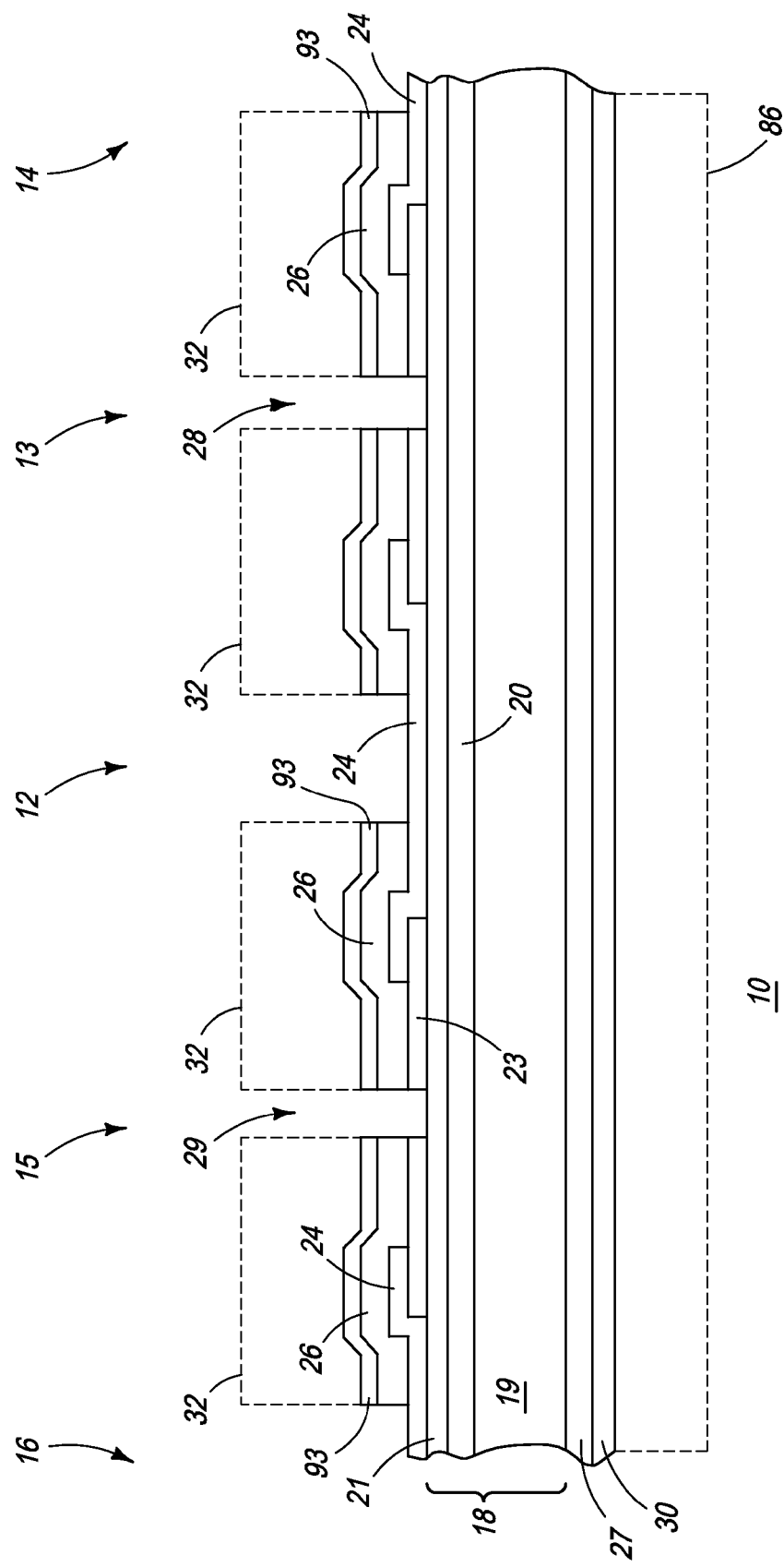

FIG. 13 illustrates the cross-sectional portion of wafer 10 in FIG. 12 at another subsequent stage in the example of the alternate embodiment of the method of singulating dice 12, 14, and 16 from wafer 10. Dielectrics 26 and 23 are etched through the openings in mask 32 and AlN 93 to expose the underlying surface of pads 24 and of substrate 18. The openings that are formed through AlN 93 and dielectrics 26 and 23 in the region where the singulation lines, such as lines 13 and 15, are to be formed function as singulation openings 28 and 29. The openings that are formed through dielectric 26 overlying pads 24 function as contact openings. The etching process preferably is performed with a process that selectively etches silicon based dielectrics such as Silicon dioxide or silicon nitride faster than it etches metals. The etching process generally etches silicon based dielectrics at least ten (10) times faster that it etches metals. The metal of pads 24 functions as an etch stop that prevents the etching from removing the exposed portions of pads 24. In the preferred embodiment, a fluorine based anisotropic reactive ion etch process is used, as explained hereinbefore.

After forming the openings through dielectrics 26 and 23, mask 32 usually is removed as illustrated by the dashed lines. Substrate 18 generally is thinned to remove material from the bottom surface of substrate 18 and reduce the thickness of substrate 18 as illustrated by dashed lines 86. Generally, substrate 18 is thinned to a thickness that is no greater than about twenty-five to four hundred (25 to 400) microns and preferably is between about fifty to two hundred fifty (50-250) microns. Such thinning procedures are well known to those skilled in the art. After wafer 10 is thinned, the backside of wafer 10 may be metalized with a metal layer 27. This metalization step may be omitted in some embodiments. Subsequently, wafer 10 usually is attached to a transport tape or carrier tape 30 that facilitates supporting the plurality of die after the plurality of die are singulated.

Figure 14:
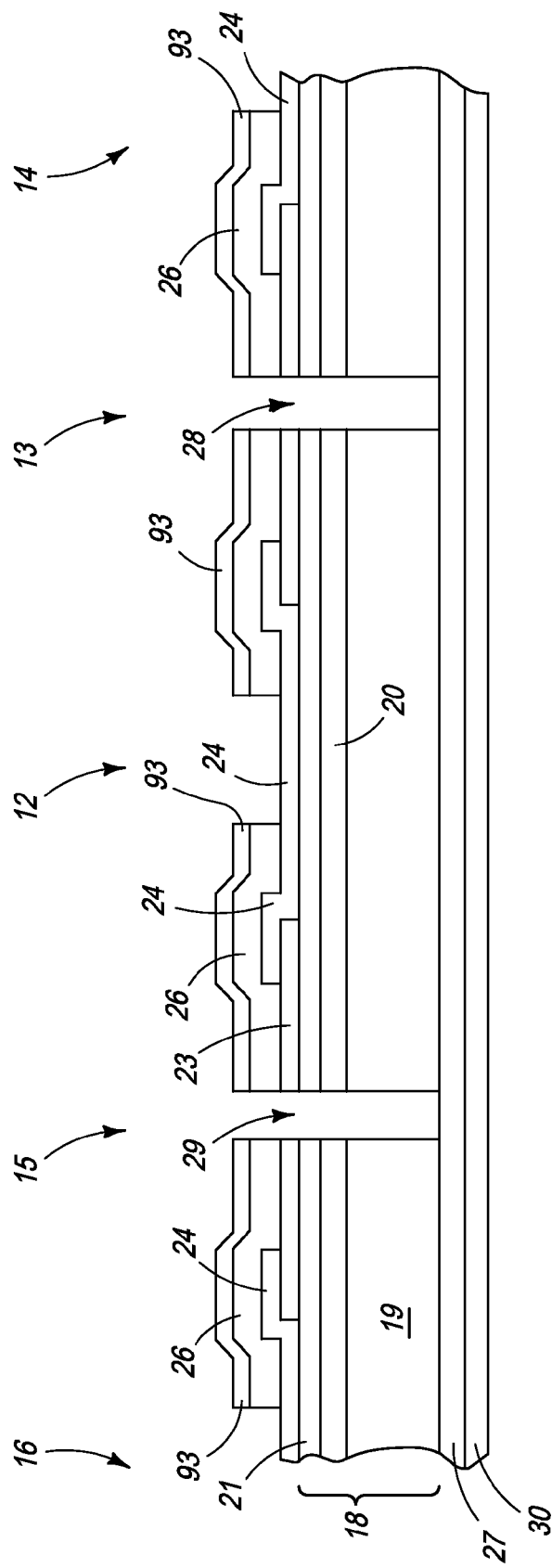

FIG. 14 illustrates wafer 10 at a subsequent stage in the example embodiment of the alternate method of singulating semiconductor die 12, 14, and 16 from wafer 10. AlN 93 is used as a mask to etch substrate 18 through singulation openings 28 and 29. AlN 93 protects dielectric 26 from being affected by the etching. AlN 93 may have a thickness of about fifty to three hundred (50-300) Angstroms and still protect dielectric 26. Preferably, AlN 93 is about two hundred (200) Angstroms thick. The etching process extends singulation opening 28 and 29 from the top surface of substrate 18 completely through substrate 18. The etching process usually is performed using a chemistry that selectively etches silicon at a much higher rate than dielectrics or metals, such as the Bosch process explained in the description of FIG. 4. Thereafter, dice 12, 14, and 16 may be removed from tape 30 as explained in the description of FIG. 4.

Because AlN 93 is a dielectric, it may be left on dice 12, 14, and 16. In other embodiments, AlN 93 may be removed after etching through substrate 18 such as by using the developer solution; however, this requires additional processing steps. Using the photo mask developer to remove the exposed portions of layer 91 saves processing steps thereby reducing the manufacturing costs. Using AlN 93 as a mask protects dielectric 26 from being effected by the etching operations.

Figure 15:
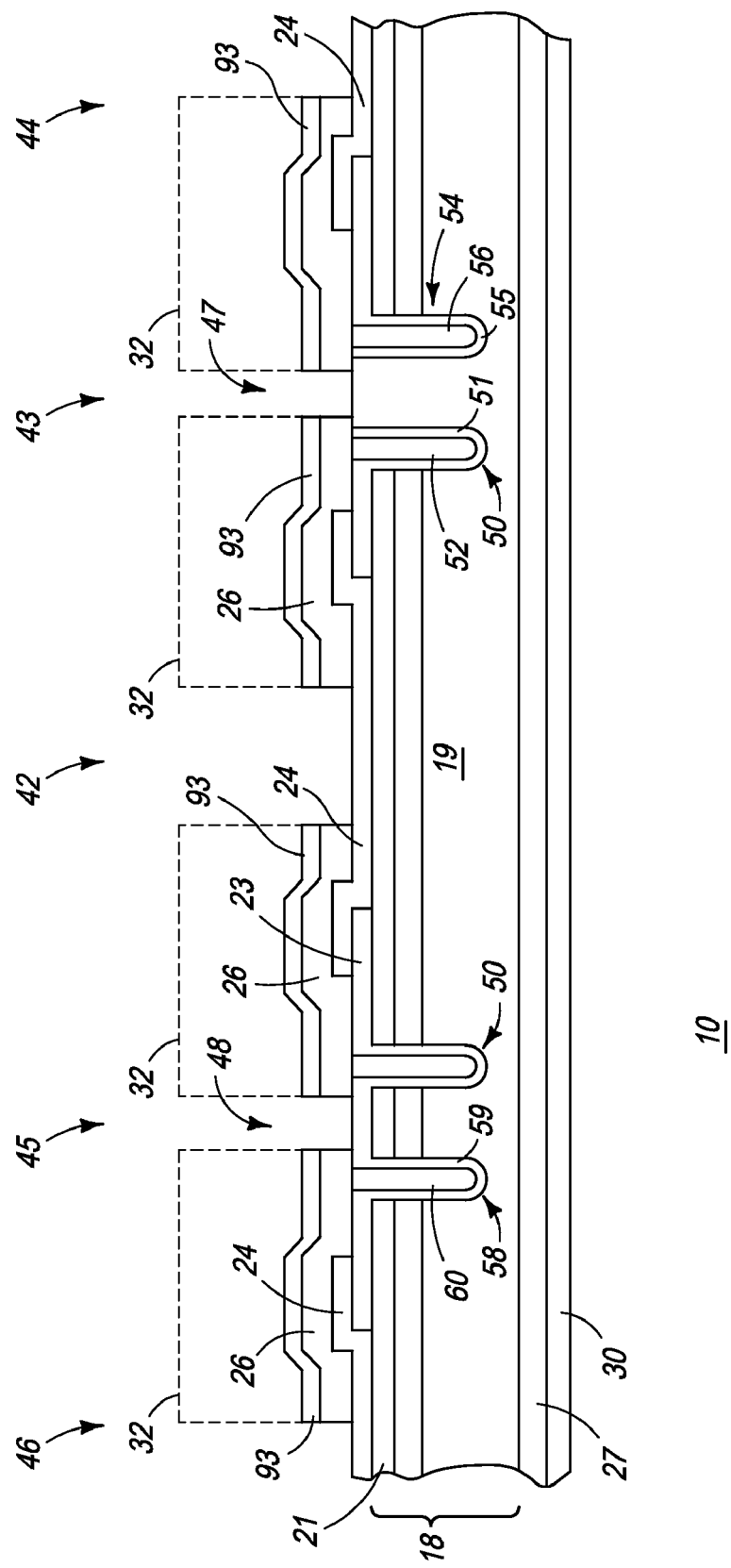
FIG. 15 illustrates an example embodiment of another method of singulating die from the semiconductor wafer of FIG. 14 in accordance with the present invention.

Those skilled in the art will appreciate that AlN 93 may be used as a singulation mask to protect dielectric 26 in any of the singulation methods described herein including the methods explained in the description of FIGS. 5-7, such as illustrated in FIG. 15, and may also be used for the methods explained in the description of FIGS. 8-10.

In other embodiments, the singulation mask may be formed from other materials instead of AlN. Those other materials for the singulation mask are materials that are not substantially etched by the process that is used to etch the silicon of substrate 18. Since the etching procedure used to etch substrate 18 etches silicon faster than metals, a metal compound may be used as the material to form the singulation mask. Examples of such metal compounds included, AlN, titanium nitride, titanium oxide, titanium oxynitride, and other metal compounds. In the example of using a metal compound other than AlN, a layer of the metal compound could be applied similarly to layer 91. Then mask 32 may be used to pattern the metal compound layer to form openings in the metal compound. Thereafter, mask 32 may be removed and the remaining portions of the metal compound could protect underlying layers, such as dielectric 26, during the etching of substrate 18. The metal compounds may be left on the die subsequent to singulation or may be removed prior to complete singulation, such as prior to separating the die from tape 30.

Also a silicon-metal compound may also be used to form the singulation mask because the metal in the metal-silicon compound prevents the etch from proceeding into the metal-silicon material. Some examples of silicon-metal compounds include metal silicides, such as titanium silicide, and cobalt silicide. For the embodiment of a silicon-metal compound, a layer of the silicon-metal compound may be formed and patterned similarly to the example of the metal compound. However, the metal-silicon compound is generally a conductor, so it would have to be removed from the die, such as removing the metal-silicon compound prior to the complete singulation of the die form tape 30.

Also, a polymer may be used for the singulation mask. One example of a suitable polymer is polyimide. Other well-known polymers may also be used. The polymer may be patterned similarly to the metal compound and then may be removed or left on the die.

Figure 16:
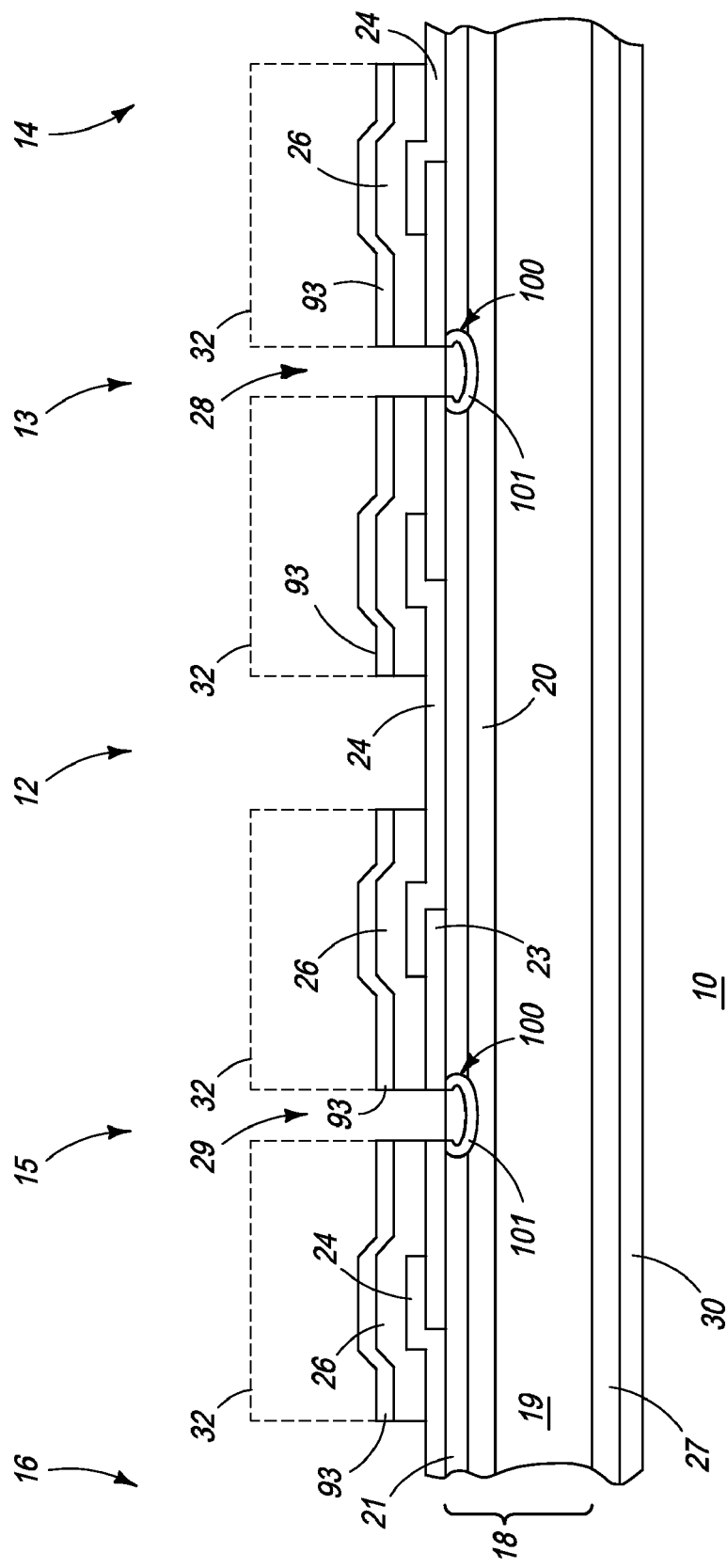
FIG. 16-FIG. 20 illustrate steps in an example embodiment of another method of singulating die from the semiconductor wafer of FIG. 1 in accordance with the present invention.

FIG. 16 illustrates a stage in an example embodiment of another alternate method of singulating semiconductor dice 12, 14, and 16 that were explained in the description of FIGS. 1 and 2-4.

As will be seen further hereinafter, one example of a method of singulating semiconductor die from a semiconductor wafer comprises: providing a semiconductor wafer having a semiconductor substrate and having a plurality of semiconductor die formed on the semiconductor substrate and separated from each other by portions of the semiconductor substrate where singulation lines are to be formed; and etching a singulation line opening through the portions of the semiconductor substrate wherein the singulation line opening is formed from a first surface of the semiconductor substrate thereby creating a space between the plurality of semiconductor die, the etching forming sidewalls of the semiconductor die wherein a top surface of the semiconductor die has a greater width that a bottom surface of the semiconductor die.

In another embodiment, the method further includes; etching the singulation line opening includes forming the width of the top surface of the die to be about two to ten (2-10) microns greater than the width of the bottom surface.

Another alternate method includes using an anisotropic etch to etch the singulation line opening a first distance into the semiconductor substrate; and etching the singulation line opening using an isotropic etch to extend the singulation line opening a second distance while also increasing a width of the singulation line opening.

As will be seen further hereinafter, the singulation method forms angled sidewalls for dice 12, 14, and 16 such that the lateral width of the die is greater at the top of the die than it is at the bottom of the die. Wafer 10 and dice 12, 14, and 16 are illustrated at a manufacturing state after etching through dielectrics 26 and 23 to expose substrate 18 and pads 24 as explained in the description of FIG. 3. Optionally, AlN 93 may be used as a mask for subsequent operations as explained in the description of FIGS. 11-14.

Subsequent to exposing the surface of substrate 18, substrate 18 and any exposed pads 24 are etched with an isotropic etching process that selectively etches silicon at a much higher rate than dielectrics or metals, generally at least fifty (50) and preferably at least one hundred (100) times faster, such as that explained in the description of FIG. 7. The etch process is performed to extend openings 28 and 29 into substrate 18 to a depth that extends the width of the openings laterally while also extending the depth to form an opening 100 in substrate 18. Because the process is used to form angled sidewalls for dice 12, 14, and 16, multiple isotropic etches will be used to successively increase the width of openings 28 and 29 as the depth of the openings extends into substrate 18. The isotropic etch is terminated after the width of openings 100 is greater than the width of openings 28 and 29 in dielectrics 23 and 26. Thereafter, a carbon based polymer 101 is applied to the portion of substrate 18 that is exposed in opening 100.

Figure 17:
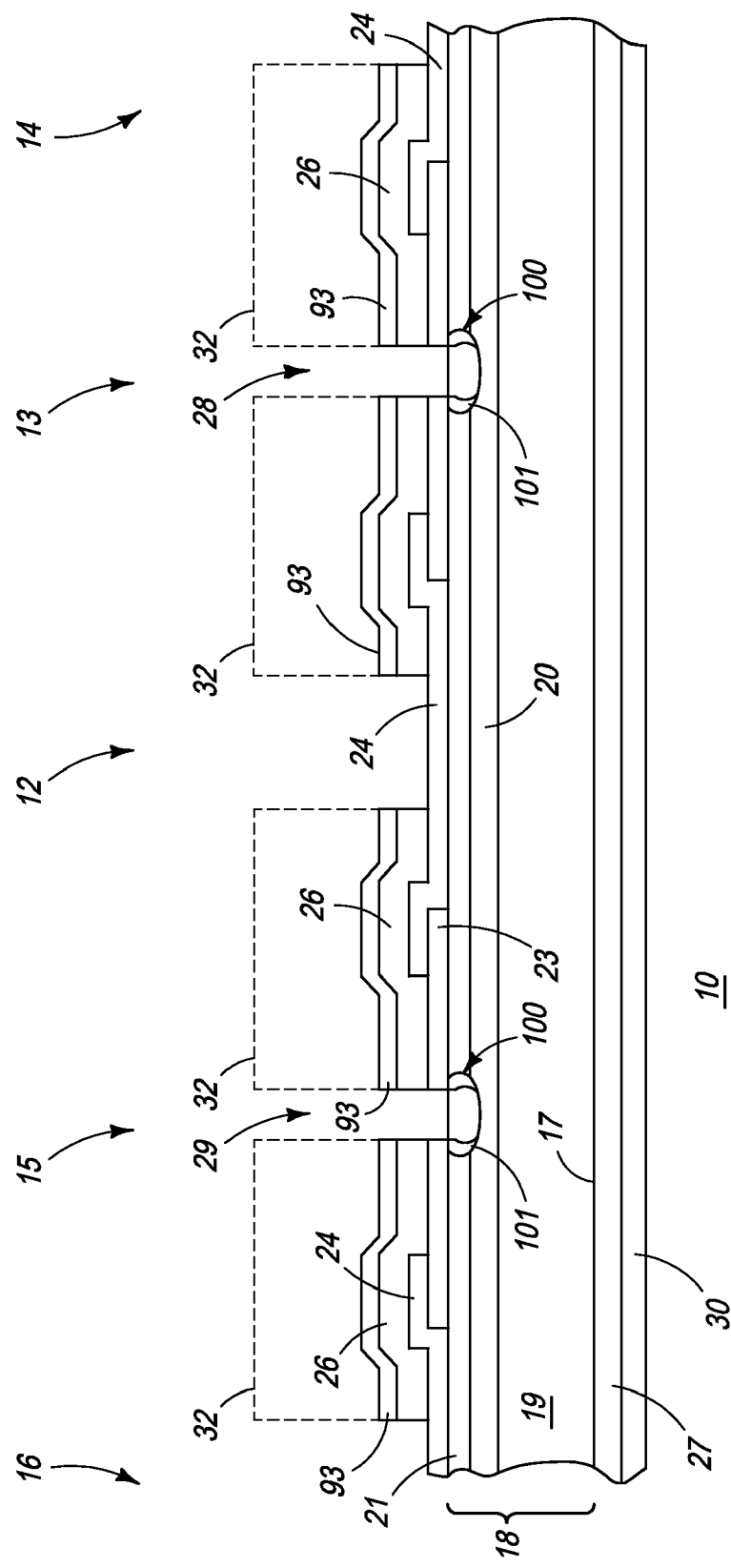

FIG. 17 illustrates a subsequent stage to the stage explained in the description of FIG. 16. An anisotropic etch is used to remove the portion of polymer 101 that is on the bottom of opening 100 while leaving the portion of polymer 101 on the sidewalls of opening 100.

Figure 18:
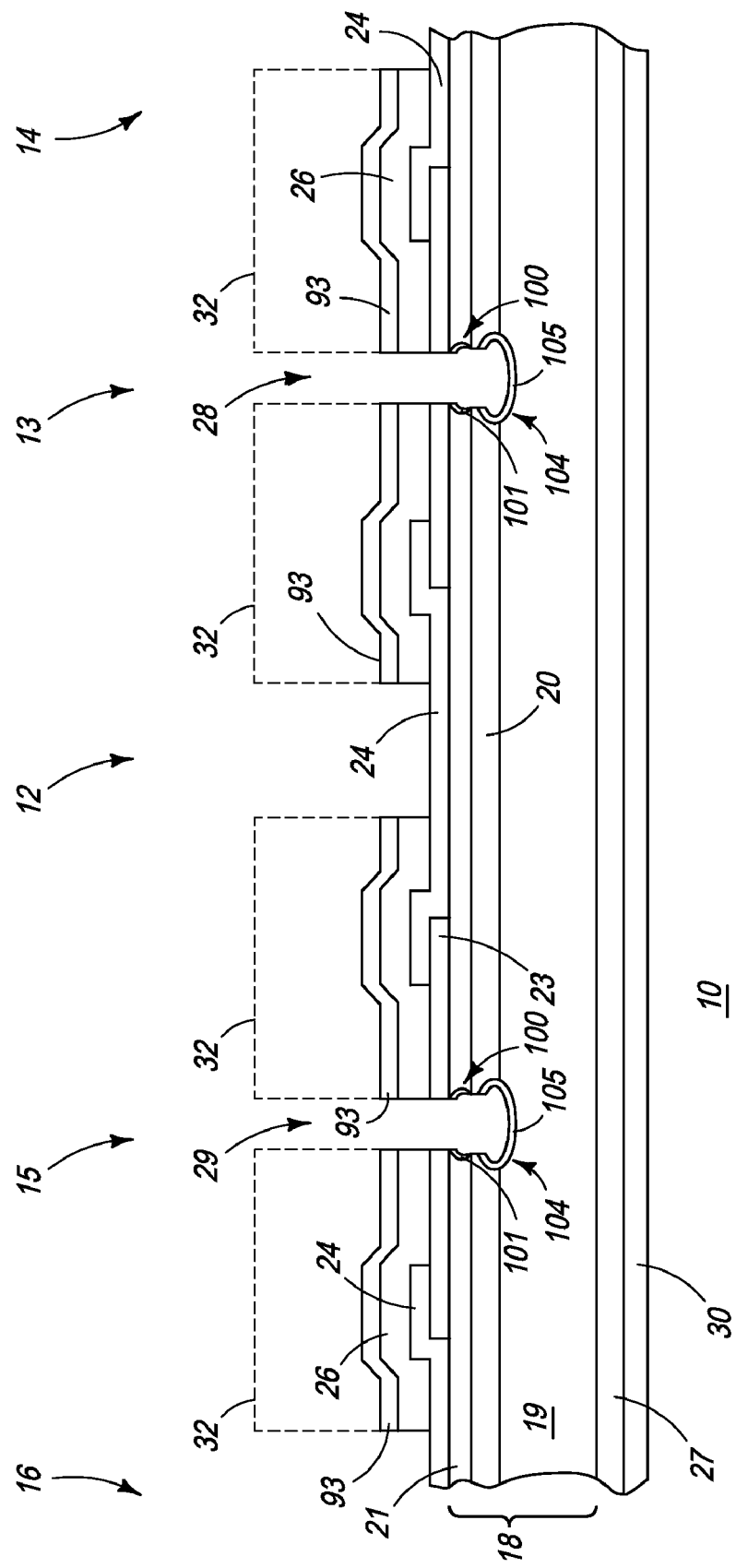

FIG. 18 illustrates a subsequent stage to the stage explained in the description of FIG. 17. The exposed surface of substrate 18 within openings 100, and any exposed pads 24, are etched with an isotropic etching process similar to the one describe in the explanation of FIG. 16. The isotropic etching again extends the width of singulation openings 28 and 29 laterally while also extending the depth to form openings 104 in substrate 18. The isotropic etch usually is terminated after the width of openings 104 is greater than the width of openings 100 in order to make the width of the openings wider as the depth increases. The portion of polymer 101 that was left on the sidewalls of opening 100 protects the sidewalls of opening 100 to prevent the etching of openings 104 from affecting the width of openings 100. Substantially all of polymer 101 is removed from the sidewalls of opening 100 during the etching of openings 104.

Thereafter, a carbon based polymer 105 that is similar to polymer 101 is applied to the portion of substrate 18 that is exposed in opening 104. During the formation of polymer 105, the operation usually forms polymer 101 again on the sidewalls of opening 100.

Figure 19:
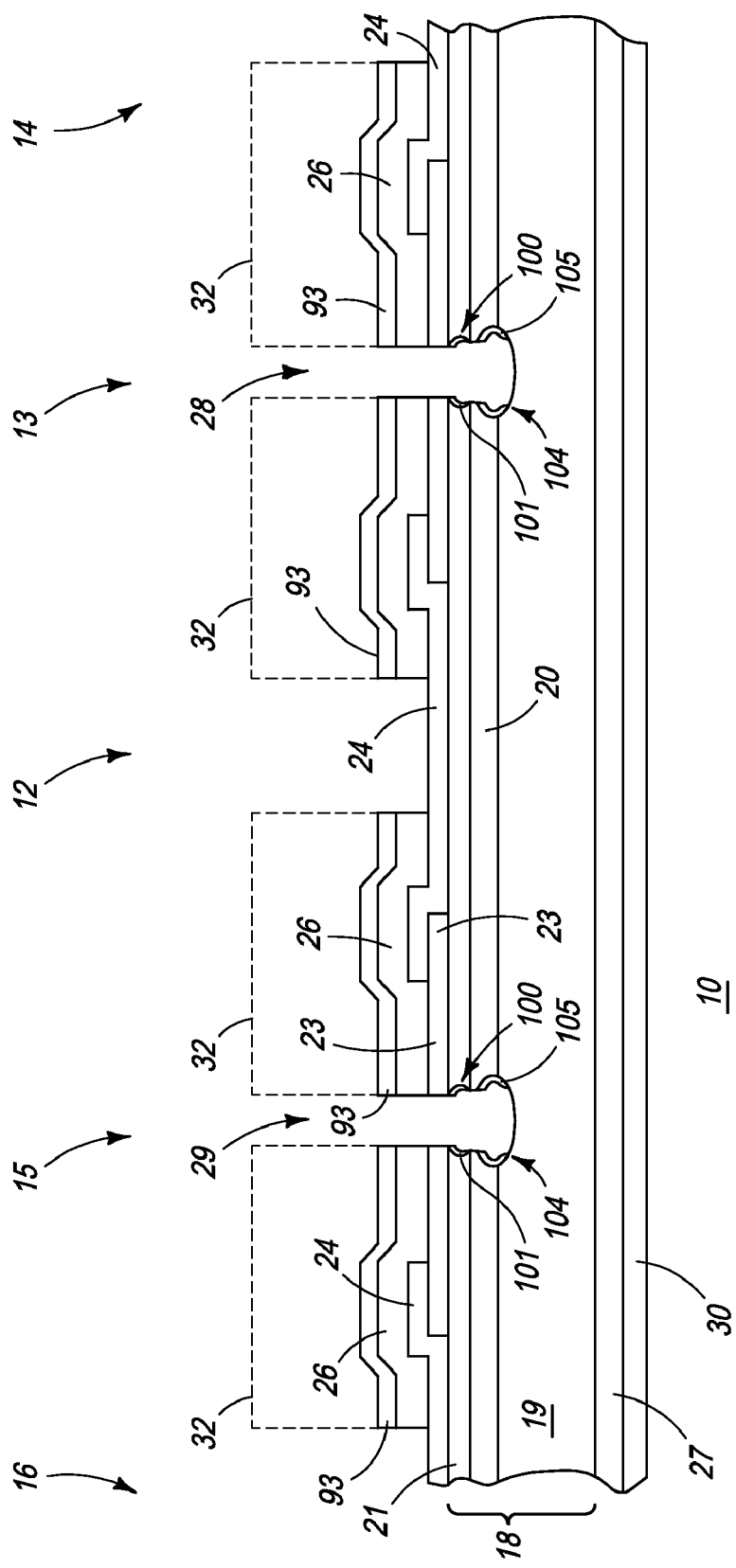

FIG. 19 illustrates another subsequent stage to the stage explained in the description of FIG. 18. Another anisotropic etch is used to remove the portion of polymer 105 that is on the bottom of opening 104 while leaving a portion of polymer 105 on the sidewalls of opening 104. This process step is similar to the step explained in the description of FIG. 17.

Figure 20:
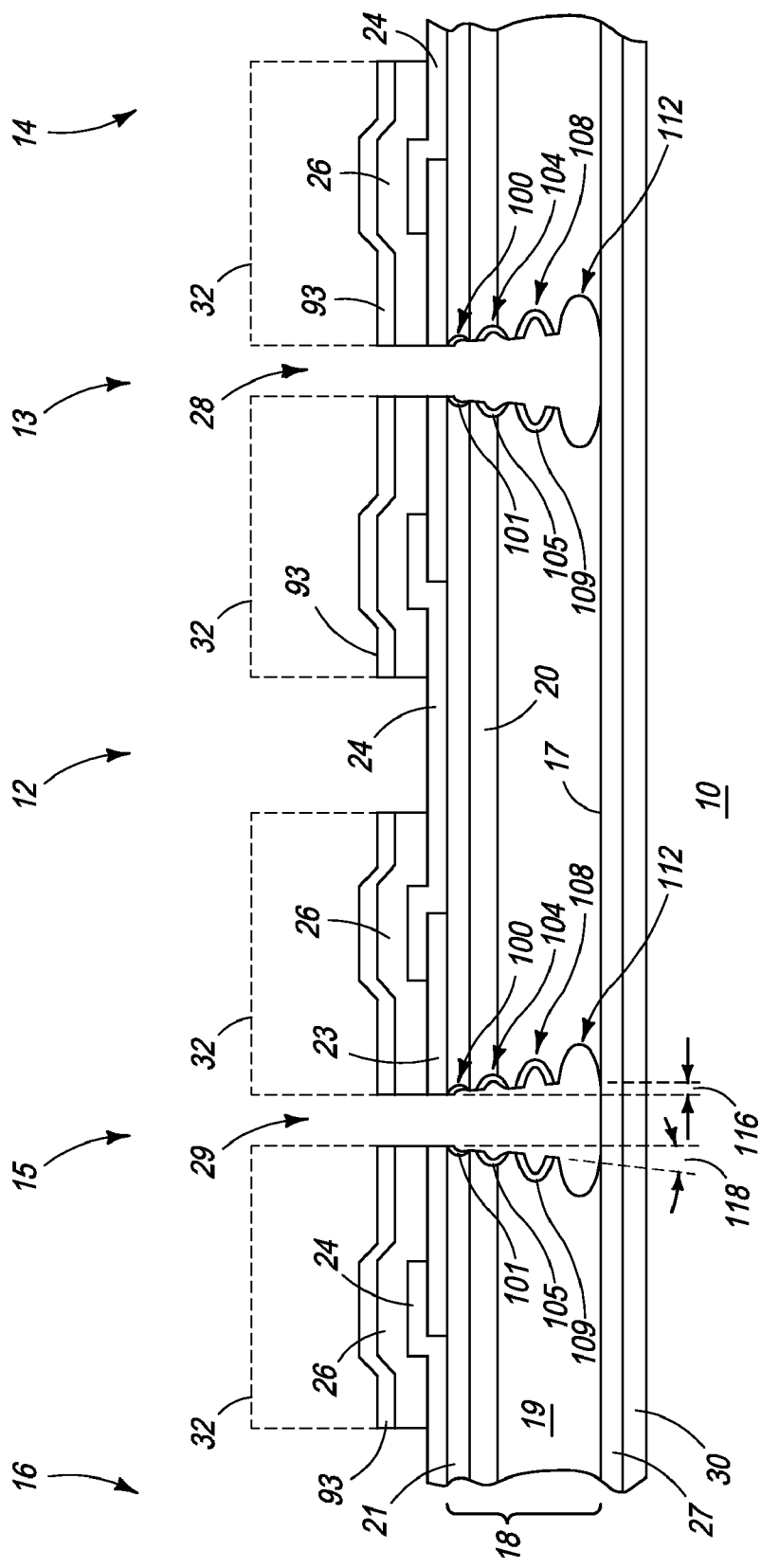

FIG. 20 illustrates that the sequence may be repeated until singulation lines 13 and 15 are completely through substrate 18. The sequence of anisotropic etching to form an opening (such as openings 108 and 112), forming a polymer on the sidewalls of the opening, and removing the polymer from the bottom of the openings while leaving a portion of the polymer on the sidewalls (such as polymers 109 and 113) can be repeated until openings 28 and 29 are extended through substrate 18 to form singulation lines 13 and 15 completely through substrate 18. After the last isotropic etch, such as the etch to form openings 112, the polymer usually is not deposited because it generally will not be needed to protect substrate 18 during subsequent operations. Although polymers 101, 105, and 109 are illustrated on the sidewalls of respective openings, 100, 104, and 108, after the completion of all operations, those skilled in the art will appreciate that the last isotropic etch step used to form opening 112 substantially removed these polymers from the sidewalls of the corresponding openings. Thus, these polymers are shown for clarity of the explanation.

As can be seen from FIG. 20 the sidewalls of dice 12, 14, and 16 slope inwardly from the top to the bottom so that the width of the die at the bottom of each die is less than the width of the die at the top of the die. Thus, the outside edge of the die at the top of substrate 18 extends a distance 116 past the outside edge of the die at the top of substrate 18, thus, the top surface of die 13 overhangs bottom surface 17 by distance 116. In one embodiment, the angled sidewalls facilitate minimizing die damage during the pick-and-place operation of the die. For such an embodiment, it is believed that distance 116 should be approximately five to ten percent (5-10%) of the thickness of die 12, 14, and 16. In one example embodiment, distance 116 is approximately one to twenty (1-20) microns, thus the width of the bottom of die 12 at the bottom of substrate 18 could be approximately two to forty (2-40) microns less than the width at the top of die 12 at surface 11. In another embodiment, it is believed that the sidewall should form an angle 118 of approximately fifteen to forty degrees (15°-40°) between the sidewall and a vertical line, such as a line perpendicular to the top surface of substrate 18. Therefore, the amount that each etch extends the width of opening 29 should be sufficient to form angle 118. Generally, the top of singulation lines 15-16 is about two to forty (2-40) microns narrower than the bottom of the singulation lines. Those skilled in the art will appreciate that the multiple isotropic etch operations forms a rough sidewall of each die 12, 14, and 16 so that the sidewall has a jagged edge along the sidewall. However, the extent of the jagged edges is exaggerated in the illustrations of FIGS. 16-21 for clarity of the explanation. These sidewalls are generally regarded as substantially smooth sidewalls.

Figure 21:
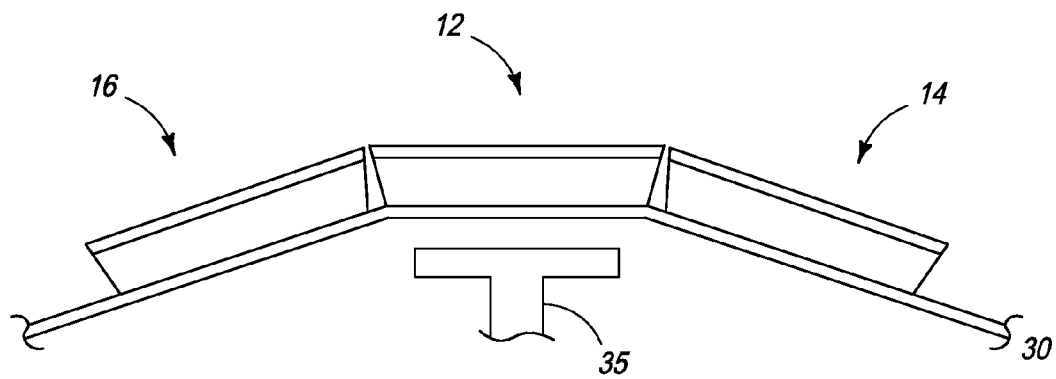
FIG. 21 illustrates another stage in an example embodiment of another method of singulating die from the semiconductor wafer of FIG. 1 in accordance with the present invention.

FIG. 21 illustrates dice 12, 14, and 16 with the inwardly sloped sidewalls during a pick-and-place operation. As can be seen, the sloped sidewalls of dice 12, 14, and 16 allow plunger 35 to move one of the die, such as die 12, upwardly without the die bumping into the other dice, such as dice 14 or 16. This helps reduce chipping and other damage to dice 12, 14, and 16 during the pick-and-place operation.

Figure 22:
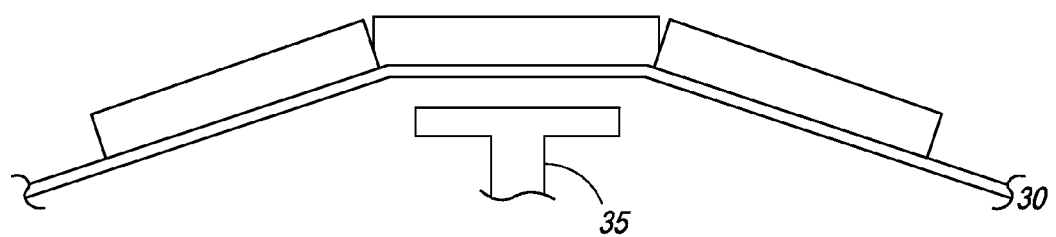
FIG. 22 illustrates another singulation method.

FIG. 22 illustrates other dice without the sloped sidewalls and how they may bump into each other during the pick operation. This configuration may cause possible damage to the die, such as to the edge of the die, during the pick-and-place operation.

Figure 23:
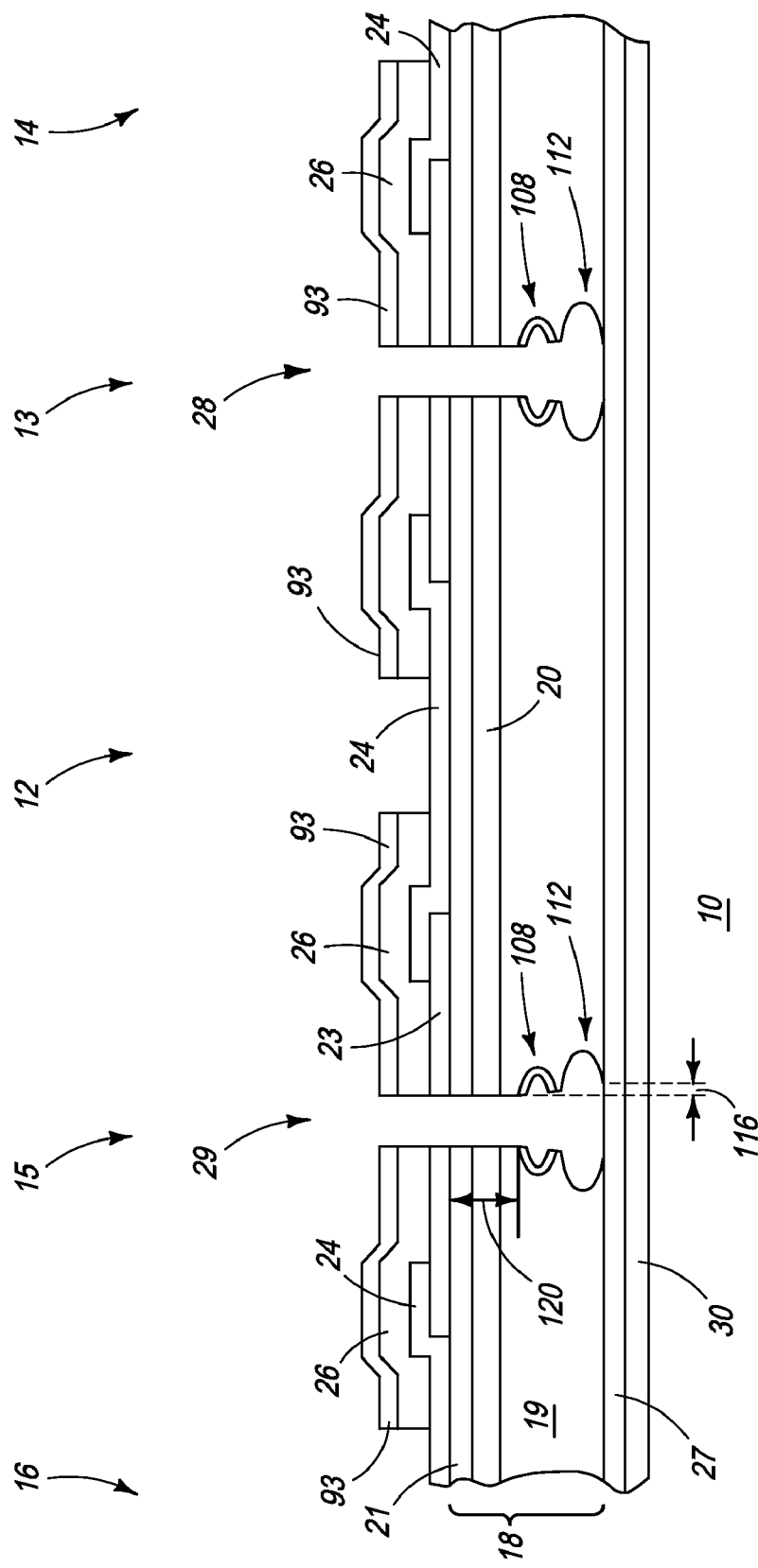
FIG. 23 illustrates a stage in an example embodiment of another method of singulating die from the semiconductor wafer of FIG. 1 that is an alternate embodiment of the method of FIG. 16-FIG. 20 in accordance with the present invention.

FIG. 23 illustrates a stage in an example of an embodiment of another alternate method of singulating semiconductor dice 12, 14, and 16 and forming angled or sloped sidewalls that were explained in the description of FIGS. 16-22. Those skilled in the art will appreciate that other die singulation techniques, such as those explained in the description of FIGS. 1-15, may also be used to singulate die from a wafer and form angled or sloped sidewalls on the die. For example, the anisotropic etch explained in the description of FIG. 14 may be used to form openings 28 and 29 a first distance 120 from the top surface of substrate 18 into substrate 18. Thus, this first distance of the sidewalls has substantially straight sidewalls. Then, the singulation method explained in the description of FIGS. 16-22 may be used to complete the singulation. The depth of first distance 120 depends on the thickness of the die, but typically would be up to about fifty percent (50%) of the thickness of the die. Thereafter, a plurality of the sequences of anisotropic etching to form an opening (such as openings 108 and 112), forming a polymer on the sidewalls of the opening, and removing the polymer from the bottom of the openings while leaving a portion of the polymer on the sidewalls (such as polymers 109 and 113) can be repeated until openings 28 and 29 are extended through substrate 18 to form singulation lines 13 and 15 completely through substrate 18.

An example of an embodiment of another alternate method of singulating semiconductor dice 12, 14, and 16 includes using an anisotropic etch such as the one explained in the description of FIG. 14 to form openings 28 and 29 first distance 120 from the top surface of substrate 18 into substrate 18. Thus, this first distance of the sidewalls has substantially straight sidewalls. Subsequently, an isotropic etch as explained in the description of FIG. 16-22 may be used to extend the depth of singulation lines 13 and 15 a second distance that is greater than distance 120 but not completely through substrate 18. The isotropic etching also increases the width of lines 13 and 15 while extending the depth. The width is extended to be wider than the width of opening 28 and 29 at dielectric 26. The final portion of the method could use an anisotropic etch to provide substantially straight sidewalls near the bottom of the singulation lines. The singulation lines would then be wider in the center. This or other combinations can then be used to provide improved functionality such as die mold lock on the sidewalls of die 12, 14, and 16 or an edge slope such that the die is wider on the bottom than on the top or wider in the center than on the top.

FIG. 24-FIG. 28 illustrates cross-sectional views of wafer 10 at various stages of an example of another alternate embodiment of singulating semiconductor die from wafer 10. The cross-sectional view of wafer 10 illustrated in FIG. 24-FIG. 28 is taken along cross-section line 24-24 of FIG. 1. The example embodiment of the alternate method illustrated in FIG. 24-FIG. 28 also includes an alternate method of reducing the thickness or thinning wafer 10. Wafer 10 includes semiconductor dice 12, 14, and 16 as well as singulation lines 13 and 15 that are described in the description of FIGS. 1-4, FIGS. 8-20, and FIG. 23. Although not shown in FIGS. 24-28 for clarity of the drawings and description, wafer 10 may also include dice 42, 44, and 46 along with singulation lines 43 and 45 and singulation openings 47-48 that were explained hereinbefore in the description of FIGS. 5-7. Because the cross-sectional portion of wafer 10 that is illustrated in FIG. 24 is a larger portion of wafer 10 than illustrated in FIGS. 2-23, FIG. 24 illustrates additional die that are formed on the top surface of wafer 10 along with additional singulation lines including singulation lines 11, 17, 137, and 138 that are similar to any of singulation lines 13 and 15 or 43 and 45 explained in the description of any of FIGS. 2-23. Additionally, FIG. 24 illustrates that substrate 18 has a thickness 66 between the top surface of substrate 18 and the bottom surface or backside of substrate 18. After semiconductor die are formed on the top surface of substrate 18, such as dice 12, 14, 16, 144, and 145, wafer 10 is thinned to reduce thickness 66 of substrate 18. An example of one embodiment of reducing thickness 66 is illustrated in FIGS. 25-28.

Referring to FIG. 25, after the semiconductor die are formed on the top surface of substrate 18, wafer 10 may be inverted and attached to a support tape or support device 34 so that the top surface of substrate 18 faces device 34. Device 34 may be any well known device that may be used to provide support for a wafer during a thinning operation such as a backgrind tape or other device.

FIG. 26 illustrates wafer 10 at a subsequent stage in the example embodiment of the method of singulating die from wafer 10. Typically, the entire bottom surface of wafer 10 is thinned in order to reduce the thickness of wafer 10 from thickness 66 to a thickness 67 that is less than thickness 66. Various well-known methods may be utilized to reduce the thickness of wafer 10 to thickness 67 such as backgrinding, chemical mechanical polishing (CMP) or other techniques that are well-known to those skilled in the art. In some embodiments, this step in the method may be omitted.

Subsequently, an interior portion 125 of the bottom surface of wafer 10 is further reduced to a thickness 68 that is less than thickness 66 and 67. The portion of the bottom surface of wafer 10 that is removed during the formation of interior portion 125 is illustrated by a dashed line. The thickness of interior portion 125 typically is reduced by subjecting interior portion 125 to a grinding operation or other well known technique to reduce the thickness. Reducing the thickness of portion 125 leaves an outer rim 127 that is juxtaposed to the outer periphery of wafer 10. Thus, outer rim 127 typically maintains thickness 67. The width of outer rim 127 is sufficient to provide support for handling or transporting the remainder of wafer 10. Tools and methods for reducing the thickness of interior portion 125 are well known to those skilled in the art. One example of such tools and methods is included in United States patent publication number 2006/0244096 of inventor Kazuma Sekiya which was published on Nov. 2, 2006.

FIG. 27 illustrates another subsequent step of singulating die from wafer 10. Support device 34 may be removed from wafer 10 and a protective layer 135 is applied to the bottom surface of wafer 10 and particularly to the bottom surface of wafer 10 in interior portion 125. Device 34 may have an ultraviolet release mechanism, such as releasing when exposed to ultraviolet light, or another well-known release mechanism. Device 34 is removed because the methods for forming layer 135 usually include a high temperature that could damage device 34. For embodiments that do not include such high temperatures or for support devices that can withstand the temperatures, device 34 may be retained. Although, device 34 usually has to be removed prior to subsequent operations. A portion of layer 135 may also be applied to the bottom surface of outer rim 127 as illustrated by protective layer portion 133. However, in some embodiments outer rim 127 may be masked to prevent forming portion 133. For example, a photo mask may be applied to cover rim 127 or a shadow mask may be used during the operation of forming layer 135 in order to prevent forming portion 133.

FIG. 28 illustrates wafer 10 at another subsequent manufacturing stage. After forming layer 135, wafer 10 usually is again inverted to an upright state. Carrier tape 30 is applied to the bottom surface of wafer 10. In some embodiments, tape 30 is attached to a film frame 62 in order to provide support for tape 30. Such film frames and carrier tapes are well known to those skilled in the art. Tape 30 is applied as a vehicle for handling and supporting wafer 10. For embodiments that use a different carrier to handle wafer 10, the different carrier may be used and tape 30 may be omitted. Tape 30 is applied as a vehicle for handling and supporting wafer 10. For embodiments that use a different carrier to handle wafer 10, the different carrier may be used and tape 30 may be omitted. Typically, a vacuum chuck is used to hold wafer 10 and to cause tape 30 to conform to the shape of the bottom surface of wafer 10 so that tape 30 provides some support for wafer 10. Thereafter, singulation openings 28, 29, 140, and 141 are formed from the top surface of wafer 10 into substrate 18 to terminate on layer 135 in a manner similar to openings 28 and 29 or openings 47 and 48 with the openings terminating on layer 27 as described hereinbefore in the description of FIG. 2-FIG. 23. Those skilled in the art will appreciate that other singulation openings are usually formed simultaneously with openings 28 and 29 in order to singulate the other die of wafer 10. Layer 135 is formed from a material that is not etched by the dry etch methods used to form singulation openings 28, 29, 140, and 141. In one embodiment, protective layer 135 is a metal or metal compound and the dry etch process is selected to be one that etches silicon at a much higher rate than metals. Such processes are explained hereinbefore. In other embodiments, protective layer 135 may be aluminum nitride as explained hereinbefore or a silicon-metal compound as explained hereinbefore. Layer 135 also may be same material as the material of metal layer 27 that is explained hereinbefore. Singulation openings 140 and 141 may also be formed along with singulation openings 28 and 29. Singulation openings 140 and 141 are formed through substrate 18 in the same manner as openings 28 and 29 (or openings 47 and 48) in order to form singulation lines 137 and 138. Singulation lines 137 and 138 are formed in order to separate outer rim 127 from the remainder of wafer 10. Consequently, singulation lines 137 and 138 usually are formed to overlie interior portion 125 and to be positioned between outer rim 127 and any semiconductor die that are positioned adjacent to rim 127, such as semiconductor die 144 and 145. For example, singulation lines 137 and 138 could be one (1) continuous singulation line that extends around an outer edge of interior portion 125 such as just inside the portion of wafer 10 where the inner periphery of outer rim 127 is formed.

Those skilled in the art will appreciate that using a wafer saw or other type of cutting tool to singulate die from a wafer having such an interior portion 125 and rim 127 would subject interior portion 125 to a lot of mechanical stress and possibly break wafer 10 within interior portion 125. Additionally, laser scribing to remove rim 127 could cause re-crystallization of die adjacent to rim 127. Using the dry etch methods explained herein to remove rim 127 minimizes mechanical stress on interior portion 125 and reduces wafer breakage while removing rim 127 or while singulation die from wafer 10.

There may be instances where it is desirable to remove rim 127 from wafer 10 without singulating the die that are formed on wafer 10. For such an alternate embodiment, singulation lines 137 and 138 may be formed to remove rim 127 from wafer 10 without forming singulation lines to singulate the die of wafer 10, such as singulation lines 11, 13, 15, and 17.

After removing rim 127, another tape, similar to tape 30, may be applied to the bottom surface of portion 125, such as directly to layer 135, and then the die may be singulated as described herein. In other embodiments, tape 30 may remain to support the remainder of wafer 10. Removing rim 127 prior to singulating the die allows for a fast and clean methodology that reduces scratches and mechanical stresses thereby improving yield and throughput.

FIG. 29-FIG. 31 illustrate various stages of another alternate embodiment of an example of a method of singulating die from wafer 10. FIG. 29 illustrates wafer 10 at a stage just after the stage explained in the description of FIG. 26. Wafer 10 is removed from support device 34, and protective layer 135 is formed on the bottom surface of interior portion 125.

Referring to FIG. 30, a carrier tape 63 may be applied to wafer 10 in order to provide support for wafer 10. Carrier tape 63 is applied to the top of wafer 10 so that the top surface of substrate 18 faces tape 63. Tape 63 typically is similar to tape 30 that was described hereinbefore. In some embodiments, tape 63 is attached to a film frame 64 that is that is similar to frame 62. Tape 63 is applied as a vehicle for handling and supporting wafer 10. For embodiments that use a different carrier to handle wafer 10, the different carrier may be used and tape 63 may be omitted. Any portion of protective layer 135 that is formed on the bottom surface of outer rim 127 is removed as illustrated by the dashed lines for portion 133. For example, the bottom surface of outer rim 127 may be subjected to a grinding process for a time sufficient to remove protective layer portions 133 as illustrated by the dashed lines, or layer 135 may be masked and portions 133 may be etched off of rim 127. As explained hereinbefore, in some embodiments, protective layer portions 133 are not formed on outer rim 127.

A dry etch process may be utilized to reduce the thickness of outer rim 127 to a thickness 69. The dry etch process utilized to reduce the thickness of outer rim 127 can be any of the dry etch processes described herein such as those that are used to form singulation openings such as singulation openings 28 and 29. Thickness 69 is less than prior thickness 67 of outer rim 127. The value of thickness 69 usually is selected so that the bottom surface of outer rim 127 is close to thickness 68 so that carrier tape 30 (see FIG. 31) may provide better support for wafer 10. In the preferred embodiment, thickness 69 forms the bottom surface of rim 127 to be substantially parallel to the outer surface of protective layer 135. Portions 133 are removed to allow the dry etch to reduce the thickness of rim 127. Portions 133 may be removed at a different stage of the method as long as portion 133 is removed prior to reducing the thickness of rim 127. In some embodiments, thickness 68 is no greater than about fifty (50) microns and may be twenty-five (25) microns or less. Those skilled in the art will appreciate that at such thicknesses, wafer 10 may become fragile. Using a dry etch process to reduce the thickness of rim 127 minimizes the mechanical stress on wafer 10 compared to other thickness reduction methods such as back-grinding or CMP.

FIG. 31 illustrates wafer 10 at a subsequent stage. After reducing the thickness of outer rim 127, wafer 10 usually is inverted and placed on carrier tape 30 as explained hereinbefore. Singulation openings 28 and 29 are formed from the top surface of substrate 18 through substrate 18 to stop on protective layer 135. Singulation openings 140 and 141 are also formed, typically along with openings 28 and 29, in order to separate outer rim 127 from the semiconductor die of wafer 10. Those skilled in the art will appreciate that other singulation openings are usually formed simultaneously with openings 28 and 29 in order to singulate the other die of wafer 10.

Because of the small thickness of wafer 10, using the dry etch to singulate the die minimizes mechanical stress on wafer 10 and reduces breakage and other damage.

FIG. 32-FIG. 33 illustrate various stages of an example embodiment of another alternate method of singulating die from wafer 10. FIG. 32 illustrates wafer 10 at a stage just after the stage described in FIG. 26. Device 34 generally is removed from wafer 10 and protective layer 135 is formed on the bottom surface of interior portion 125 as explained hereinbefore. Protective layer 135 may be patterned to have openings through protective layer 135 that are substantially aligned with the portion of wafer 10 where the singulation lines of wafer 10, such as singulation lines 11, 13, 15, 17, 137, and 138, are to be formed. Those skilled in the art will appreciate that various backside alignment techniques may be utilized for ensuring that the openings formed in layer 135 are positioned to align with the portion of substrate 18 where singulation lines are to be formed, such as singulation lines 13, 15, 137, and 138.

Referring to FIG. 33, protective layer 135 may be used as a mask to protect substrate 18 while a dry etch process is utilized to form singulation openings 28, 29, 140, and 141 to extend from the bottom surface of substrate 18 all the way through substrate 18 and exiting the top surface of substrate 18. Any of the dry etch methods explained for forming singulation openings 28 and 29 or 47 and 48 may also be used to form singulation openings 140 and 141 and any other singulation openings through substrate 18. While forming the singulation openings, the process also etches outer rim 127 thereby reducing the thickness of outer rim 127 to thickness 69. As explained hereinbefore in the description of FIG. 30, any portion of protective layer portion 133 is removed prior to reducing the thickness of rim 127 and etching the singulation openings. Reducing the thickness of portion 127 along with forming singulation openings reduces the processing steps thereby reducing manufacturing costs, and reducing the thickness also minimizes mechanical stress on wafer 10 thereby improving yield and reducing costs. The reduced thickness of rim 127 makes it easier to handle wafer 10 and remove the die after they are singulated. In other embodiments, rim 127 may be masked and not etched while forming openings 28, 29, 140, and 141. After forming the singulation openings, another carrier tape (not shown), such as carrier tape 30, may be applied to the bottom surface of wafer 10, such as to the bottom surface of interior portion 125, and wafer 10, or interior portion 125, may be inverted. Thereafter, the semiconductor die may be removed by a pick-and-place or other techniques as described hereinbefore.

The skilled artisan can understand that one example of a method of forming a semiconductor die comprises: providing a semiconductor wafer having a semiconductor substrate, the semiconductor substrate having a first thickness, a top surface, a bottom surface, and a plurality of semiconductor die, such as die 12, 14, or 16, formed on the top surface of the semiconductor substrate and separated from each other by portions of the semiconductor wafer where singulation lines, such as lines 13 and 15, are to be formed; inverting the semiconductor wafer; reducing a thickness of an interior portion, such as portion 125, of the bottom surface of the semiconductor wafer to a second thickness that is less than the first thickness and leaving an outer rim, rim 127 for example, of the semiconductor wafer with the first thickness wherein the outer rim is juxtaposed to a periphery of the semiconductor wafer, and wherein the interior portion is underlying the plurality of semiconductor die; forming a protective layer on the interior portion of the bottom surface of the semiconductor wafer wherein the protection layer is one of a metal or a metal compound or a metal-silicon compound; and using a dry etch to reduce the first thickness of the outer rim to a third thickness that is less than the first thickness wherein the protective layer protects the interior portion from the dry etch so that the second thickness remains substantially constant.

One skilled in the art will understand that the method may also include patterning the protective layer to expose portions of the semiconductor substrate where the singulation lines are to be formed; and using the dry etch to etch the singulation lines from the bottom surface of the semiconductor substrate through the semiconductor substrate to the top surface of the semiconductor substrate.

An example of another method of forming a semiconductor die comprises: providing a semiconductor wafer having a semiconductor substrate, the semiconductor substrate having a first thickness, a top surface, a bottom surface, and a plurality of semiconductor die, such as die 12/14/16, formed on the top surface of the semiconductor substrate and separated from each other by portions, such as portions 13/15, of the semiconductor wafer where singulation lines are to be formed; reducing a thickness of an interior portion, such as portion 125, of the bottom surface of the semiconductor wafer to a second thickness that is less than the first thickness and leaving an outer rim, such as a rim 127, of the semiconductor wafer with the first thickness wherein the outer rim is juxtaposed to a periphery of the semiconductor wafer, and wherein the interior portion is underlying the plurality of semiconductor die; forming a protective layer on the interior portion of the bottom surface of the wafer wherein the protection layer is one of a metal or a metal compound or a metal-silicon compound; and using a dry etch to form singulation openings where the singulation lines are to be formed including forming the singulation openings through the semiconductor substrate wherein at least one singulation opening is formed between the outer rim and any semiconductor die adjacent to the outer rim.

The skilled artisan will also appreciate that the method may also include using a dry etch to form the singulation opening from the top surface of the semiconductor wafer through the semiconductor substrate.

The method may also include patterning the protective layer to expose portions of the bottom surface of the semiconductor wafer where the singulation lines are to be formed; and the step of using the dry etch to form the singulation openings may include using the protective layer as a mask while using the dry etch to etch the singulation openings from the bottom surface of the semiconductor wafer through the semiconductor substrate to the top surface of the semiconductor substrate, and using the dry etch to etch the outer rim and reduce the first thickness of the outer rim to a third thickness that is less than the first thickness.

In view of all of the above, it is evident that a novel device and method is disclosed. Included, among other features, is etching singulation openings completely through a semiconductor wafer using a dry etch procedure. Such dry etch procedures are generally referred to as plasma etching or reactive ion etching (RIE). Etching the openings from one side assists in ensuring that the singulation openings have very straight side-walls thereby providing a uniform singulation line along each side of each semiconductor die. Etching the singulation openings completely through the semiconductor wafer facilitate forming narrow singulation lines thereby allowing room to use for forming semiconductor die on a given wafer size. All of the singulation lines generally are formed simultaneously. The etching process is faster than a scribing or wafer sawing process, thereby increasing the throughput of a manufacturing area.

Forming the singulation lines through the filler material of a trench facilitates forming narrow singulation lines thereby increasing wafer utilization and reducing costs. Using a singulation mask, assists in protecting internal portions of a die while forming the singulation lines through the substrate. Forming angled sidewalls reduces damage during assembly operations thereby reducing costs. The sloped sidewalls generally are formed on all of the die simultaneously.

While the subject matter of the invention is described with specific preferred embodiments, it is evident that many alternatives and variations will be apparent to those skilled in the semiconductor arts. For example, layers 20 and/or 21 may be omitted from substrate 18. The singulation openings alternately may be formed prior to or subsequent to forming the contact openings overlying pads 24. Also, the singulation openings may be formed before thinning wafer 10, for example, the singulation openings may be formed partially through substrate 18 and the thinning process may be used to expose the bottom of the singulation openings.

The invention claimed is:

1. A method of forming a semiconductor die comprising:
providing a semiconductor wafer having a semiconductor substrate, the semiconductor substrate having a first thickness, a top surface, a bottom surface, and a plurality of semiconductor die formed on the top surface of the semiconductor substrate and separated from each other by portions of the semiconductor wafer where singulation lines are to be formed;
inverting the semiconductor wafer;
reducing a thickness of an interior portion of the bottom surface of the semiconductor wafer to a second thickness that is less than the first thickness and leaving an outer rim of the semiconductor wafer with the first thickness wherein the outer rim is juxtaposed to a periphery of the semiconductor wafer, and wherein the interior portion is underlying the plurality of semiconductor die;
forming a protective layer on the interior portion of the bottom surface of the semiconductor wafer wherein the protection layer is one of a metal or a metal compound or a metal-silicon compound; and
using a dry etch to reduce the first thickness of the outer rim to a third thickness that is less than the first thickness wherein the protective layer protects the interior portion from the dry etch so that the second thickness remains substantially constant.

2. The method of claim 1 wherein using the dry etch to reduce the first thickness includes using a dry etch that etches silicon faster than metals.

3. The method of claim 1 wherein inverting the semiconductor wafer includes attaching a support device to the top surface of the semiconductor wafer prior to inverting the semiconductor.

4. The method of claim 3 further including removing the support device prior to forming the protective layer.

5. The method of claim 3 further including attaching a carrier tape to the bottom surface of the semiconductor wafer subsequent to the step of using the dry etch to reduce the first thickness, and using a dry etch to form singulation lines from the top surface of the semiconductor wafer into the semiconductor substrate.

6. The method of claim 4 wherein using the dry etch to form singulation lines includes forming the singulation lines through the semiconductor wafer to stop on the protective layer.

7. The method of claim 1 wherein forming the protective layer includes patterning the protective layer to expose portions of the semiconductor substrate where the singulation lines are to be formed; and
wherein using the dry etch to reduce the first thickness includes using the dry etch to etch the singulation lines from the bottom surface of the semiconductor substrate through the semiconductor substrate to the top surface of the semiconductor substrate.

8. The method of claim 1 further including removing any protective layer from the bottom surface of the outer rim prior to the step of using the dry etch to reduce the first thickness.

9. A method of forming a semiconductor die comprising:
providing a semiconductor wafer having a semiconductor substrate, the semiconductor substrate having a first thickness, a top surface, a bottom surface, and a plurality of semiconductor die formed on the top surface of the semiconductor substrate and separated from each other by portions of the semiconductor wafer where singulation lines are to be formed;
reducing a thickness of an interior portion of the bottom surface of the semiconductor wafer to a second thickness that is less than the first thickness and leaving an outer rim of the semiconductor wafer with the first thickness wherein the outer rim is juxtaposed to a periphery of the semiconductor wafer, and wherein the interior portion is underlying the plurality of semiconductor die;
forming a protective layer on the interior portion of the bottom surface of the wafer wherein the protection layer is one of a metal or a metal compound or a metal-silicon compound; and
using a dry etch to form singulation openings where the singulation lines are to be formed including forming the singulation openings through the semiconductor substrate wherein at least one singulation opening is formed between the outer rim and any semiconductor die adjacent to the outer rim.

10. The method of claim 9 wherein using the dry etch includes using the dry etch to form the singulation openings from the top surface of the semiconductor wafer through the semiconductor substrate and exposing a portion of the protective layer wherein the protective layer is an etch stop for the dry etch.

11. The method of claim 10 further including using another dry etch subsequently to the step of forming the protective layer including using the another dry etch to reduce the first thickness of the outer rim to a third thickness; and wherein the step of using the dry etch to form the singulation openings includes using the dry etch to form the singulation opening from the top surface of the semiconductor wafer through the semiconductor substrate.

12. The method of claim 9 wherein forming the protective layer includes patterning the protective layer to expose portions of the bottom surface of the semiconductor wafer where the singulation lines are to be formed; and
wherein the step of using the dry etch to form the singulation openings includes using the protective layer as a mask while using the dry etch to etch the singulation openings from the bottom surface of the semiconductor wafer through the semiconductor substrate to the top surface of the semiconductor substrate, and using the dry etch to etch the outer rim and reduce the first thickness of the outer rim to a third thickness that is less than the first thickness.

13. The method of claim 12 further including removing any portions of the protective layer on the bottom surface of the outer rim prior to the step of using the dry etch to form the singulation openings.

14. The method of claim 12 further including masking the bottom surface of the outer rim to prevent forming any of the protective layer on the bottom surface of the outer rim.

15. The method of claim 9 wherein reducing the thickness of the interior portion of the bottom surface of the semiconductor wafer includes grinding the interior portion.

* * * * *